US006211697B1

(12) United States Patent
Lien et al.

(10) Patent No.: US 6,211,697 B1
(45) Date of Patent: Apr. 3, 2001

(54) INTEGRATED CIRCUIT THAT INCLUDES A FIELD-PROGRAMMABLE GATE ARRAY AND A HARD GATE ARRAY HAVING THE SAME UNDERLYING STRUCTURE

(75) Inventors: Jung-Cheun Lien, San Jose; Sheng Feng, Cupertino; Chung-yuan Sun; Eddy Chieh Huang, both of San Jose, all of CA (US)

(73) Assignee: Actel, Sunnyvale, CA (US)

( * ) Notice: Subject to any disclaimer, the term of this patent is extended or adjusted under 35 U.S.C. 154(b) by 0 days.

(21) Appl. No.: 09/318,198

(22) Filed: May 25, 1999

(51) Int. Cl.[7] .......................... H03K 7/38; H03K 19/177
(52) U.S. Cl. ................................................. 326/41; 326/39
(58) Field of Search ................................. 326/38, 39, 40, 326/41

(56) References Cited

U.S. PATENT DOCUMENTS

| 4,908,528 | 3/1990 | Huang ................................. 307/443 |
| 5,805,496 | 9/1998 | Batson et al. ....................... 365/154 |
| 5,809,281 | 9/1998 | Steele et al. ..................... 395/497.01 |
| 5,818,750 | 10/1998 | Manning ............................. 365/154 |
| 5,825,202 | * 10/1998 | Tavana et al. ....................... 326/39 |
| 5,841,295 | * 11/1998 | Kaviani ............................... 326/39 |
| 6,020,755 | * 2/2000 | Andrews et al. .................... 326/39 |
| 6,031,391 | * 2/2000 | Couts-Martin et al. .............. 326/38 |

* cited by examiner

*Primary Examiner*—Son Mai
(74) *Attorney, Agent, or Firm*—McCutchen, Doyle, Brown & Enersen, LLP

(57) ABSTRACT

An integrated circuit (IC) includes both a field-programmable gate array (FPGA) and a hard array (HA). The FPGA includes a first set of functional groups that each include an underlying logic structure and memory cells for programming the underlying logic structure, a first set of routing buses, and a first set of routing interconnect areas that provide interconnections between the first set of functional groups and the first set of routing buses. The first set of routing interconnect areas includes transistors and memory cells for programming the interconnections. The HA includes a second set of functional groups that is equal in number to the first set of functional groups and that are arranged like the first set of functional groups. Each functional group in the second set of functional groups includes an underlying logic structure that is like the underlying logic structure of the first set of functional groups but which does not include memory cells for programming the underlying logic structure. The HA also includes a second set of routing buses that are arranged like the first set of routing buses and a second set of routing interconnect areas that are arranged like the first set of routing interconnect areas but which do not include transistors and memory cells for programming interconnections.

17 Claims, 19 Drawing Sheets

INTEGRATED CIRCUIT THAT INCLUDES A FIELD-PROGRAMMABLE GATE ARRAY AND A HARD GATE ARRAY HAVING THE SAME UNDERLYING STRUCTURE

BACKGROUND OF THE INVENTION

1. Field of the Invention

The present invention relates to gate arrays, and more particularly, to an integrated circuit that includes both a field-programmable gate array and a mask metal programmable (or "hard") gate array having the same underlying structure.

2. Description of the Related Art

A field-programmable gate array (FPGA) is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the FPGA. A cell may also contain one or two flip-flops. Two types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M-M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory CM determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process. A field-programming unit typically uses design software to program the FPGA. The design software translates a specific configuration of the programmable switches desired by the end-user into a bit stream which is fed into the FPGA. The bit stream creates the pattern of the data in the configuration memory CM that determines whether each memory cell stores a "1" or a "0". The stored bit in each CM controls whether its associated transistor switch is turned on or off.

Designers of FPGAs (as well as other PLDs) often provide their circuit designs to IC manufacturers who embed the FPGA designs into larger ICs. An example of such a larger IC is a system on a chip (SOC) that includes the embedded FPGA as well as several other components. The several other components may include, for example, a microprocessor, memory, arithmetic logic unit (ALU), state machine, etc. In this scenario the embedded FPGA may be only a small part of the whole SOC.

When an FPGA that has been programmed to perform one specific function is compared to an application specific integrated circuit (ASIC) that has been designed and manufactured to perform that same specific function, the FPGA will necessarily be a larger device than the ASIC. This is because FPGAs are very flexible devices that are capable of implementing many different functions, and as such, they include a large amount of excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the FPGA programming circuitry. This excess circuitry is typically eliminated in the design of an ASIC which makes the ASIC a smaller device. An ASIC, on the other hand, is not a flexible device. In other words, once an ASIC has been designed and manufactured it cannot be reconfigured to perform a different function like the FPGA can.

Similar to an ASIC, a "hard" gate array (GA), i.e., a non-programmable GA, can be designed to perform a specific function. Such a GA will also be smaller than an FPGA that has been programmed to perform that same specific function due to the elimination of excess circuitry. Furthermore, a GA is more likely to be a faster device and less power consuming than an FPGA. This is because many of the circuit connections within the FPGA are provided by transistors, whereas circuit connections in the GA are hard-wired connections. The transistor connections, even when the transistors are turned on, provides more resistance than a hard-wired connection. This results in slower speed with greater power consumption.

As mentioned above, FPGAs are typically programmed with design software that compiles a specific user design into FPGA configuration data. The design software assembles the configuration data into a bit stream, i.e., a stream of ones and zeros, that is used to program the configuration memories for the programmable switches in the FPGA. Design software may also be used to program hard GAs. In the hard GA scenario, instead of generating a bit stream, the design software generates data indicating where metal connections are to be made in the GA.

End users typically use design software to test different designs and run simulations for FPGAs and GAs. Separate design software packages, however, have heretofore been used for FPGAs and GAs. In other words, one design software package is used for programming FPGAs, and a different design software package is used for designing hard GAs. The requirement for different design software packages is cumbersome, particularly in the scenario where the FPGA and the GA are embedded in the same IC. This is because in order to model or simulate the FPGA and the hard GA working together, the designer must manually combine the results of the different design software packages.

Thus, there is a need for an apparatus and method that permits the same design software package to be used for programming FPGAs and for designing hard GAs.

BRIEF SUMMARY OF THE INVENTION

The present invention provides an integrated circuit (IC) that includes a field-programmable gate array (FPGA) and a hard array (HA). The FPGA is based on a specific underlying logic and routing structure and includes a plurality of transistors and memory cells coupled to the specific underlying logic and routing structure for programming the specific underlying logic and routing structure. The HA is also based on the specific underlying logic and routing structure but it does not include transistors and memory cells coupled to the specific underlying logic and routing structure that are used for programming the specific underlying logic and routing structure.

The present invention also provides a method of making an IC. The method includes forming an FPGA on a semiconductor substrate with the FPGA being based on a specific underlying logic and routing structure and including a plurality of transistors and memory cells coupled to the specific underlying logic and routing structure for programming the specific underlying logic and routing structure; and forming an HA on the semiconductor substrate with the HA also based on the specific underlying logic and routing structure but not including transistors and memory cells coupled to the specific underlying logic and routing structure that are used for programming the specific underlying logic and routing structure.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
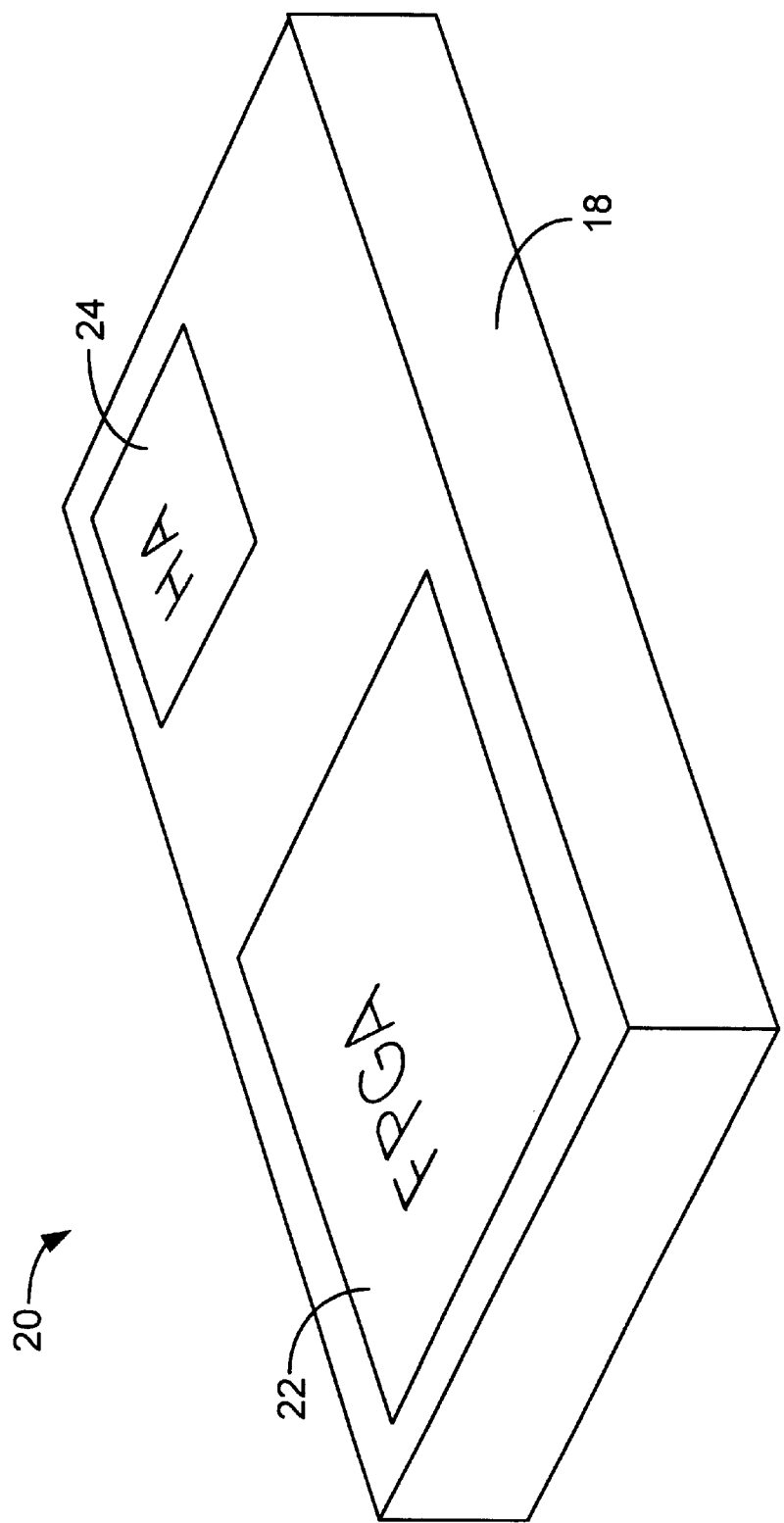
FIG. 1 is an isometric diagram illustrating an integrated circuit (IC) in accordance with the present invention.

Referring to FIG. 1, there is illustrated an integrated circuit (IC) 20 in accordance with the present invention. The IC 20 includes a semiconductor substrate 18, a field-programmable gate array (FPGA) 22 and a hard array (HA) 24. The FPGA 22 is, of course, field-programmable and may also be referred to as a "soft array (SA)." The HA 24, on the other hand, is a mask metal programmable gate array which is programmed during the IC chip manufacturing process. It may also be referred to as a "hard gate array". Thus, the IC 20 includes both a field-programmable gate array 22 and a mask metal programmable, or "hard," gate array. The IC 20 may be considered a type of programmable logic device (PLD). As will be discussed below, it should be well understood that the IC 20 may include more than one FPGA and/or more than one HA and that such FPGA(s) and HA(s) may be arranged in any configuration on the IC 20.

In accordance with the present invention, the FPGA 22 and the HA 24 include the same underlying logic and routing structure. This concept will be described in more detail below, but in general, much of the excess circuitry (e.g., programmable switches and corresponding memories) of the FPGA 22 has been eliminated in the HA 24, but the HA 24 retains the same underlying logic and routing structure as the FPGA 22. Because the programmable switches, memory cells, and programming circuitry have been taken out of the HA 24, the size of the HA 24 has been reduced.

Although the FPGA 22 and the HA 24 include the same underlying logic and routing structure, they differ in the way that configuration data is stored on the device. Specifically, in the FPGA 22 the configuration data is stored in memory cells which are used for turning transistor switches on and off, and in the HA 24 the configuration data is stored as hard-wired connections.

One advantage of having the same underlying logic and routing structure in both the FPGA 22 and the HA 24 is that the same design software package may be used for both devices. In other words, the design software package that is used for programming the FPGA 22 may also be used for designing the HA 24. The same design software can work for both the FPGA 22 and the HA 24 with minimal changes in handling the availability of switching points and the generation of configuration data. Thus, the implementation of the HA 24 is done in a factory, preferably using the top layer mask or a near top layer mask to deposit metal connections to selected areas, as dictated by the configuration data provided by the companion design software.

The HA 24 region of the IC 20 can be used to implement dedicated predefined circuit functions that are popular to a certain segment of the application areas. For example, the HA 24 can be used to implement a 64 bit 66 MHz PCI master, RISC processor, USB interface/controller, LAN controller, MPEG decoder, ATM controller, and other application specific functions. Circuits implemented using the HA 24 can run at a much higher speed while occupying smaller silicon area compared to the FPGA 22.

The FPGA 22 region of the IC 20 allows the customization of design in the field. The storage of configuration data on the device is similar to the general FPGA style, i.e., the configuration data, generated by the companion design software, can be stored either on or off chip. By setting this configuration data, the functionality of the FPGA 22 is customized. Thus, the FPGA 22 region can be used to customize circuits designed in the field and preserve the flexibility of the IC 20.

Figure 2:
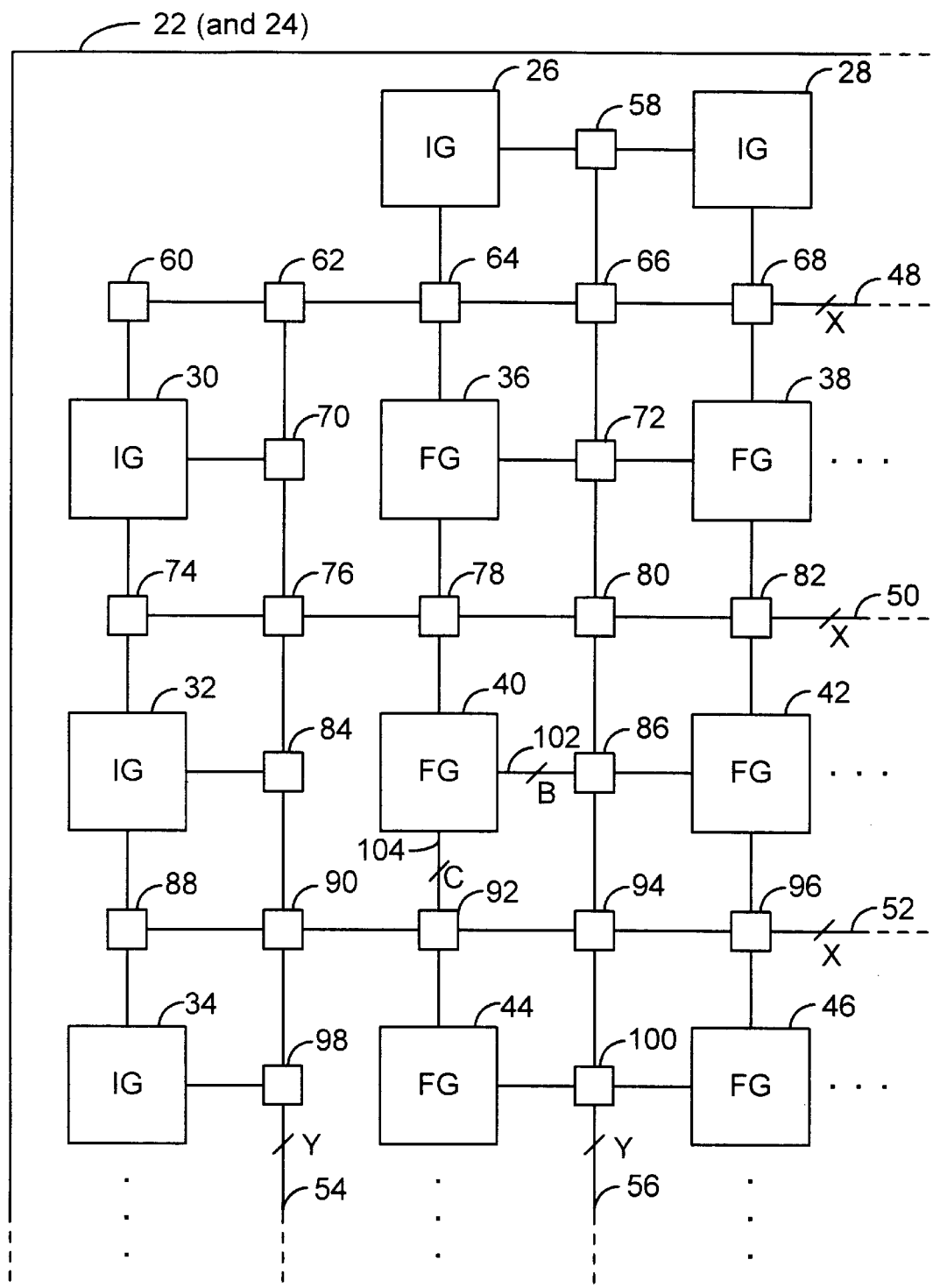
FIG. 2 is a block diagram illustrating an underlying logic and routing structure on which the FPGA and the HA shown in FIG. 1 may be based.

In order to illustrate that the FPGA 22 and the HA 24 include the same underlying logic and routing structure, the internal components of each device will be examined. Referring to FIG. 2, there is illustrated some of the internal components that are typically found in the FPGA 22. In other words, FIG. 2 illustrates an example of a specific underlying logic and routing structure on which the FPGA 22 may be based. Specifically, the FPGA 22 may include several interface groups (IGs) 26, 28, 30, 32, 34 and several functional groups (FGs) 36, 38, 40, 42, 44, 46. The IGs 26, 28, 30, 32, 34 are used for interfacing the FPGA 22 to other devices on the IC 20, such as the HA 24, or to pad rings for connecting the FPGA 22 to the IC 20 package pins. The FGs 36, 38, 40, 42, 44, 46 are small multifunction circuits that are capable of realizing all Boolean functions. In general, the IGs 26, 28, 30, 32, 34 and the FGs 36, 38, 40, 42, 44, 46 form the logic structure of the FPGA 22.

Also included in the FPGA 22 are several horizontal routing buses 48, 50, 52, and several vertical routing buses 54, 56. By way of example, the horizontal routing buses 48, 50, 52 may each include X number of lines, and the vertical routing buses 54, 56 may each include Y number of lines. In order to transfer data from one routing bus to another routing bus several routing interconnect areas 58, 60, 62, 64, 66, 68, 70, 72, 74, 76, 78, 80, 82, 84, 86, 88, 90, 92, 94, 96, 98, 100 are included in the FPGA 22. The routing interconnect areas 62, 66, 76, 80, 90, 94 are used to transfer data from one of the vertical routing buses 54, 56 to one of the horizontal routing buses 48, 50, 52. The other routing interconnect areas 58, 60, 64, 68, 70, 72, 74, 78, 82, 84, 86, 88, 92, 96, 98, 100 are used to transfer data to or from one of the IGs 26, 28, 30, 32, 34 or one of the FGs 36, 38, 40, 42, 44, 46 to or from one of the vertical routing buses 54, 56 or one of the horizontal routing buses 48, 50, 52. In general, the routing buses and the routing interconnect areas form the routing structure of the FPGA 22.

If the specific underlying logic and routing structure shown in FIG. 2 is used as the specific underlying logic and routing structure of the FPGA 22, then the specific underlying logic and routing structure shown in FIG. 2 will also be the specific underlying logic and routing structure of the HA 24. This is because, as mentioned above, the FPGA 22 and the HA 24 include the same underlying logic and routing structure in accordance with the present invention.

Figure 3:
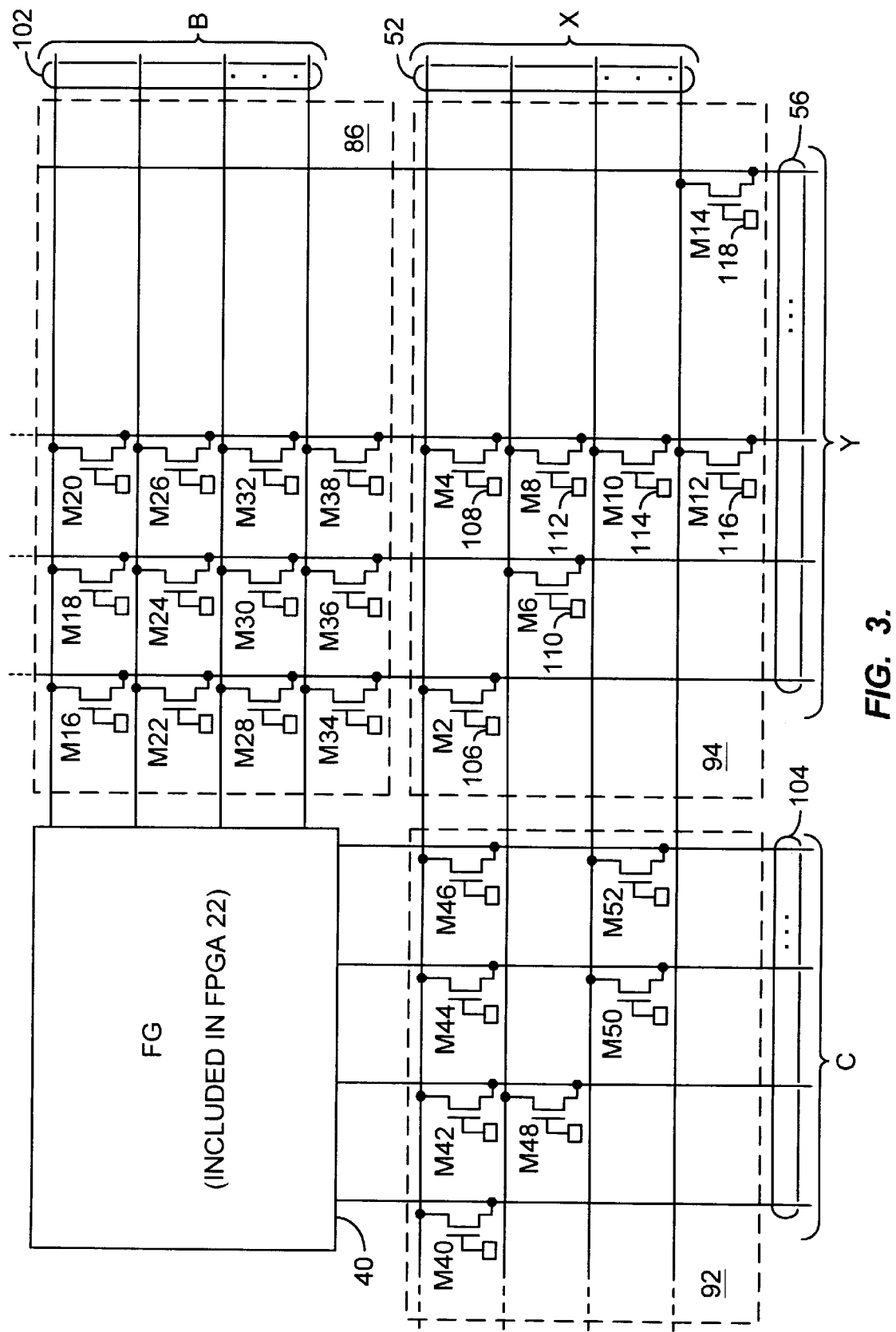
FIG. 3 is a schematic diagram illustrating a routing structure that may be used in the FPGA shown in FIG. 1.

Referring to FIG. 3, the operation of the routing buses and the routing interconnect areas will be described in further detail. The FG 40 and its nearby routing interconnect areas 86, 92, 94 are illustrated. The routing interconnect area 86 is connected to the FG 40 with bus 102 which has B number of lines, and the routing interconnect area 92 is connected to the FG 40 with bus 104 which has C number of lines. In a typical scenario, the FG 40 outputs data onto bus 102 and the routing interconnect area 86 is used to transfer data from bus 102 onto bus 56. Similarly, the routing interconnect area 92 may be used to transfer data from bus 52 onto bus 104 where the data is input into the FG 40.

Each of the routing interconnect areas 86, 92, 94 includes several transistor switches and corresponding memory cells which are used for making the connections between the various buses. Specifically, the routing interconnect area 94 includes several transistor switches M2, M4, M6, M8, M10, M12, M14 and corresponding memory cells 106, 108, 110, 112, 114, 116, 118. Each of the memory cells stores one bit of configuration data to control whether or not its corresponding transistor switch is turned on or off. When a transistor switch is turned on, the lines to which it is connected are coupled together.

Similarly, the routing interconnect area 86 includes several transistor switches M16, M18, M20, M22, M24, M26, M28, M30, M32, M34, M36, M38, and the routing interconnect area 92 includes several transistor switches M40, M42, M44, M46, M48, M50, M52. Each of these transistor switches has an associated memory cell for storing configuration data. As shown in FIG. 3, the routing interconnect areas 92, 94 do not include transistor switches at every intersection of lines included in buses 52, 56, 104. When a transistor switch is included at every intersection of lines, this is known as a "fully populated" routing interconnect area. It should be well understood that the number of transistor switches used and their positioning in the FPGA 22 is not important to the present invention. The specific arrangement and positioning of IGs, FGs, routing buses, routing interconnect areas, and switching transistors within routing interconnect areas will vary greatly depending on the particular application. It should be understood that the configurations illustrated in FIGS. 2 and 3 are example configurations and that the present invention includes any configuration of devices in the FPGA 22.

Figure 4:
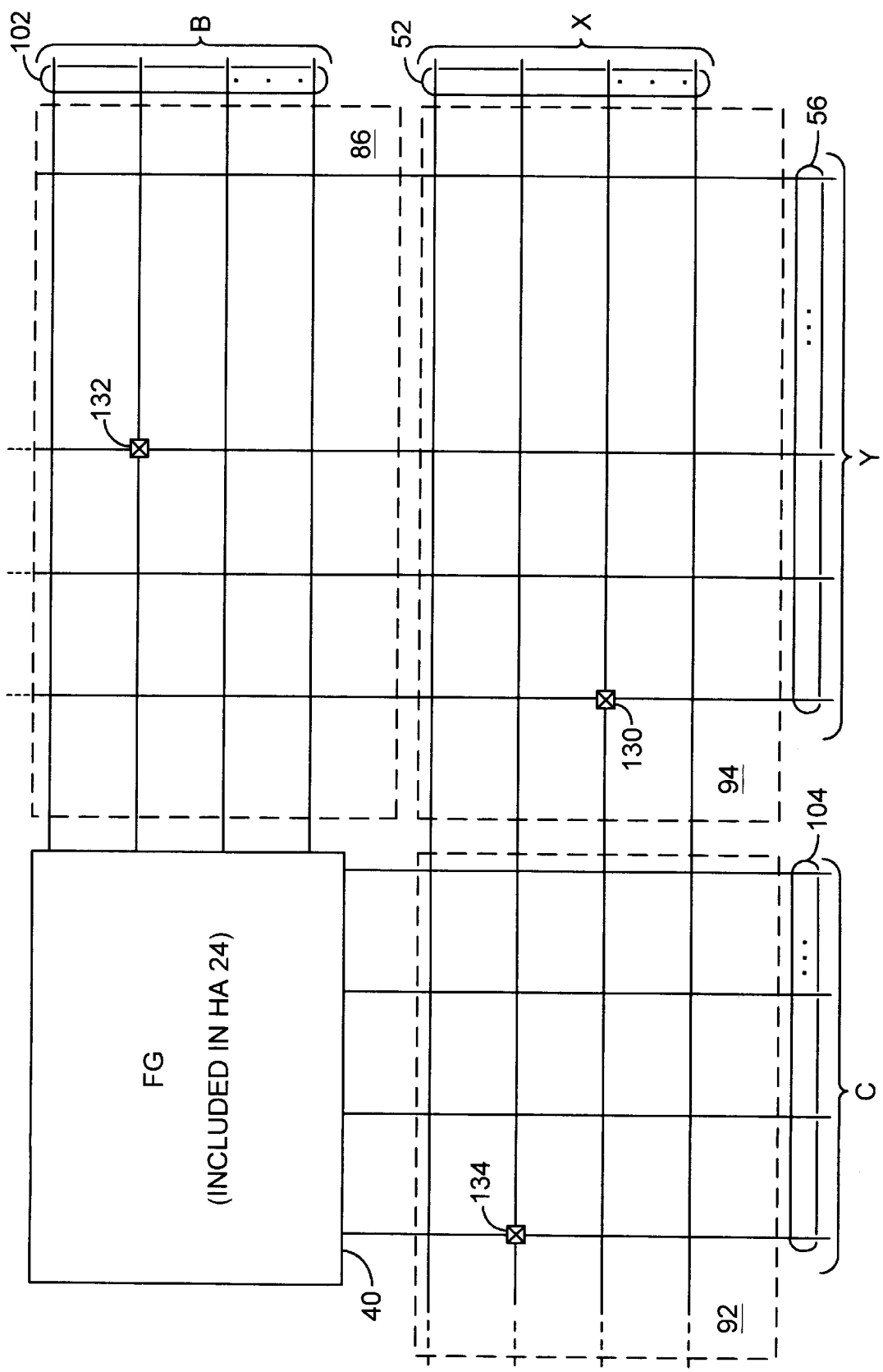
FIG. 4 is a schematic diagram illustrating a routing structure that may be used in the HA shown in FIG. 1.

As mentioned above, the FPGA 22 and the HA 24 include the same underlying logic and routing structure, except that all of the excess circuitry has been removed from the HA 24. Specifically, the programmable switches, memory cells, and control circuit for downloading configuration data has been removed from the HA 24. The removal of programmable switches and memory cells is illustrated in FIG. 4 which shows circuitry included in the HA 24 that corresponds to the circuitry shown in FIG. 3 included in the FPGA 22. As can be seen, all of the transistor switches and corresponding memory cells have been removed in the FIG. 4 version. The basic routing structure, however, remains the same in the FIG. 4 version as it is in the FIG. 3 version.

Because the basic routing structure shown in FIGS. 3 and 4 is the same, the same design software package can be used to program (or design) both devices 22 and 24. Specifically, when programming the FPGA 22 the design software generates configuration data that is used to turn selected transistor switches either on or off. For example, the configuration data may include a "1" that is to be stored in memory cell 114 in order to turn on transistor M10. When designing the HA 24, on the other hand, the design software generates data indicating where metal connections are to be made. For example, the design software may indicate that a metal connection be made at point 130 in the routing interconnect area 94 shown in FIG. 4. Similarly, the design software may indicate that a metal connection be made at point 132 in the routing interconnect area 86 and at point 134 in the routing interconnect area 92. Thus, with the FPGA 22 the design software programs a data bit, whereas with the HA 24 the design software programs a metal connection, i.e., it translates a connection into a metal piece. In this way the same design software is used to design both the FPGA 22 and the HA 24, which is different from the prior practice described above of using two different design software packages.

The metal connections 130, 132, 134 are made during the IC manufacturing process. The connections are preferably made in the last one or two mask steps. For example, in one scenario the metal connections in the HA 24 are programmed by changing only one metal mask, i.e., the last metal mask, and then the product is shipped.

There are at least two general ways to make the metal connections 130, 132, 134 during a semiconductor manufacturing process. First, one can "program the metal", meaning that metal is deposited during the manufacturing process on a selected metal layer. The deposited metal is extra metal that is used to connect the selected nodes. This is a horizontal connection. Second, one can "program the hole", meaning that different metal layers are connected together with "via," hole connections. This second technique may also be referred to as "via hole connection programming" or "contact programming". In this way, different layers of metal are connected together that cause the selected nodes to be connected. This is a vertical connection. These two methods can be used together or separately and provide many, many options for connecting two points or nodes. The nodes can be connected using many different metal layers. Thus, the manner in which the metal connections 130, 132, 134 are made will vary depending on the particular application. For example, the metal connections 130, 132, 134 may be made with via hole connections, which is one type of vertical connection, or the metal connections 130, 132, 134 may be made by depositing metal, which is one type of horizontal connection.

As demonstrated by FIGS. 3 and 4, the FPGA 22 and the HA 24 include the same underlying routing structure. Namely, FIG. 3 illustrates circuitry included in the FPGA 22 and FIG. 4 illustrates the corresponding circuitry that is included in the HA 24. The FPGA 22 and the HA 24 also include the same underlying logic structure. In general, the logic structure of an FPGA is provided by its interface and functional groups, such as for example IGs 26, 28, 30, 32, 34 and FGs 36, 38, 40, 42, 44, 46 in the FPGA 22. A functional group typically includes look-up tables (LUTs), configurable functional blocks, and other circuits capable of realizing Boolean functions. In an FPGA, such as the FPGA 22, the functional groups also typically include memory cells that are used to configure logic functions such as addition, subtraction, etc.

Figure 5:
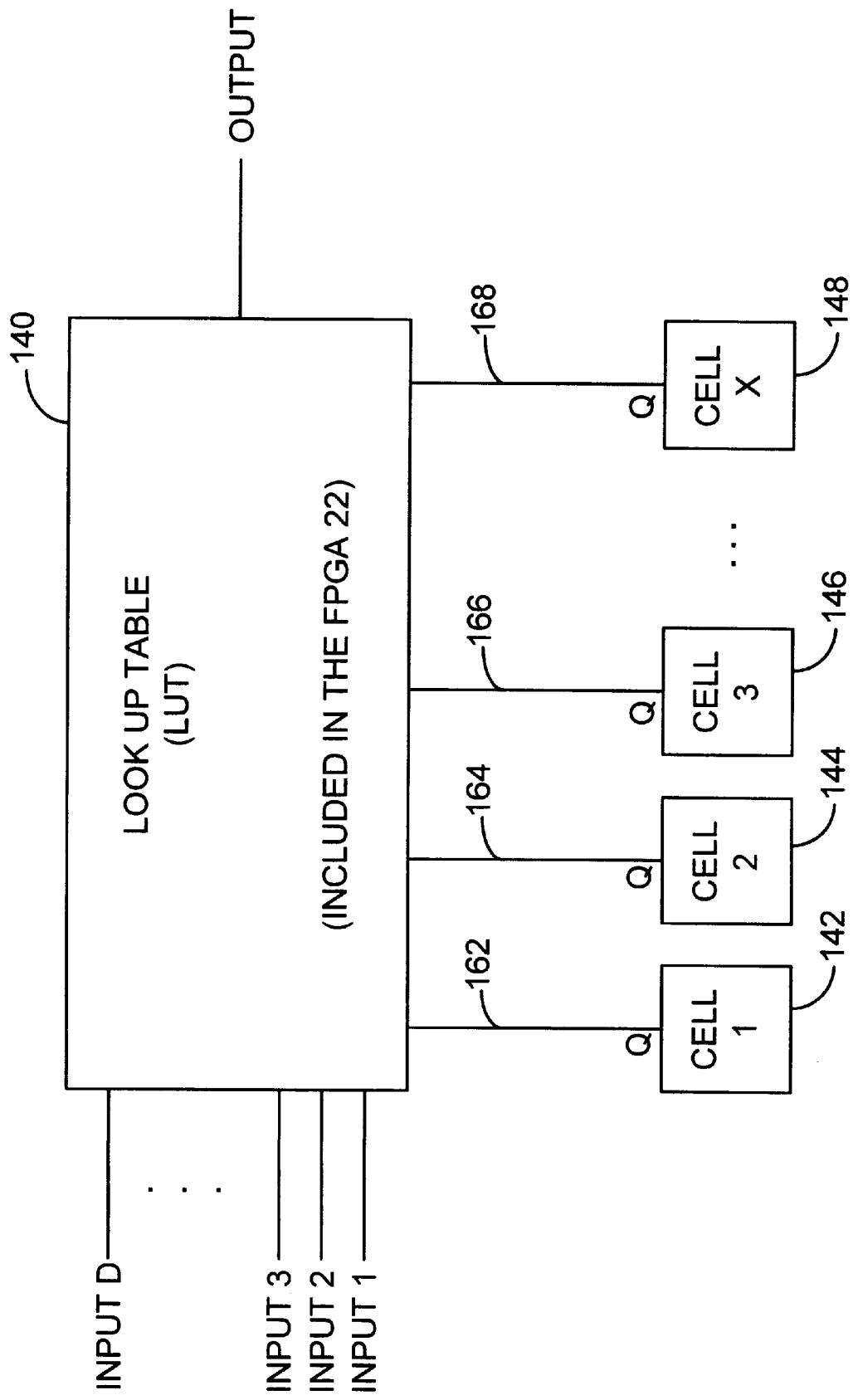
FIG. 5 is a schematic diagram illustrating a look-up table that may be included in functional groups used in the FPGA shown in FIG. 1.

Referring to FIG. 5, there is illustrated an LUT 140 of the type that is typically included in a functional group, such as the FGs 36, 38, 40, 42, 44, 46 in the FPGA 22. The LUT 140 includes Inputs 1, 2, 3, . . . D, and an Output. The LUT 140 is configured by programming the memory cells 142, 144, 146, . . . 148. Each of the memory cells 142, 144, 146, . . . 148 may be programmed to have a "1" or a "0" on its Q output, and the specific setting of all of the memory cells 142, 144, 146, . . . 148 taken together provides a specific configuration for the LUT 140. The configuration data used to program the memory cells 142, 144, 146, . . . 148 is generated by design software. Once a specific configuration of the memory cells 142, 144, 146, . . . 148 is decided upon, the Inputs 1, 2, 3, . . . D may be used to generate the Output in accordance with the desired logic function.

Figure 6:
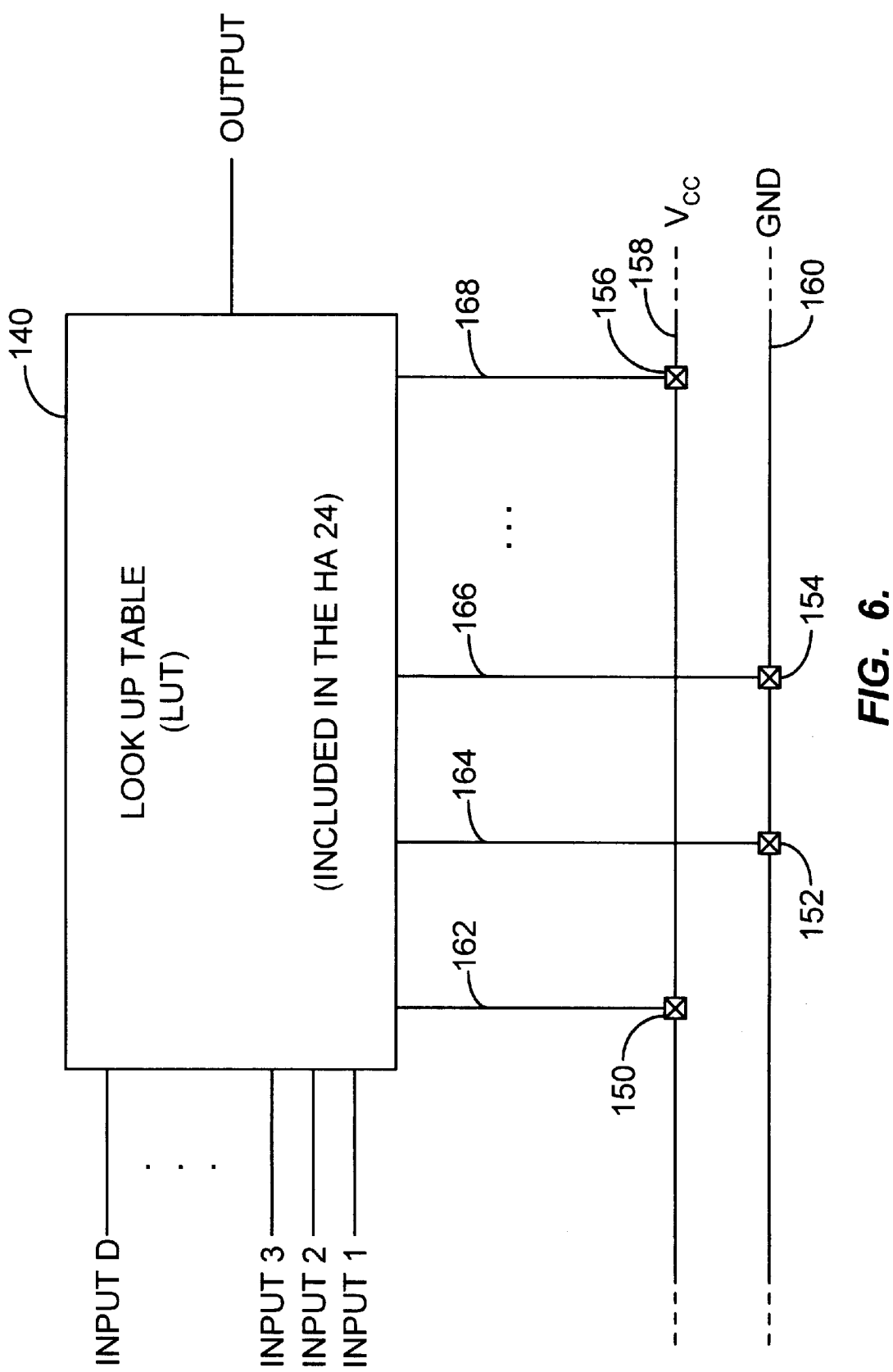
FIG. 6 is a schematic diagram illustrating a look-up table that may be included in functional groups used in the HA shown in FIG. 1.

The removal of the memory cells 142, 144, 146, . . . 148 from the LUT 140 in the HA 24 is illustrated in FIG. 6 which shows the manner in which the LUT 140 is embodied in the HA 24. As can be seen, the memory cells 142, 144, 146, . . . 148 have been removed in the FIG. 6 version for use in the HA 24. The basic LUT 140 structure, however, remains the same in the FIG. 6 version.

In the HA 24, instead of using the design software to program memory cells to configure the LUT 140, the design software is used to generate data indicating which of the configuration inputs 162, 164, 166, 168 should be coupled to $V_{cc}$ and which should be coupled to ground. These connections are made during the IC manufacturing process using metal connections. For example, if the configuration inputs 162, 168 are supposed to receive a "1", then the design software will indicate that these inputs are to be connected to the $V_{cc}$ line 158 at points 150, 156, respectively. If the configuration inputs 164, 166 are supposed to receive a "0", then the design software will indicate that these inputs are to be connected to the ground line 160 at points 152, 154, respectively. Similar to above, the metal connections 150, 152, 154, 156 may be made with via hole connections (vertical connections) or by depositing metal (horizontal connections). Furthermore, the metal connections 150, 152, 154, 156 are made during the IC manufacturing process, preferably in the last one or two mask steps.

Figure 7:
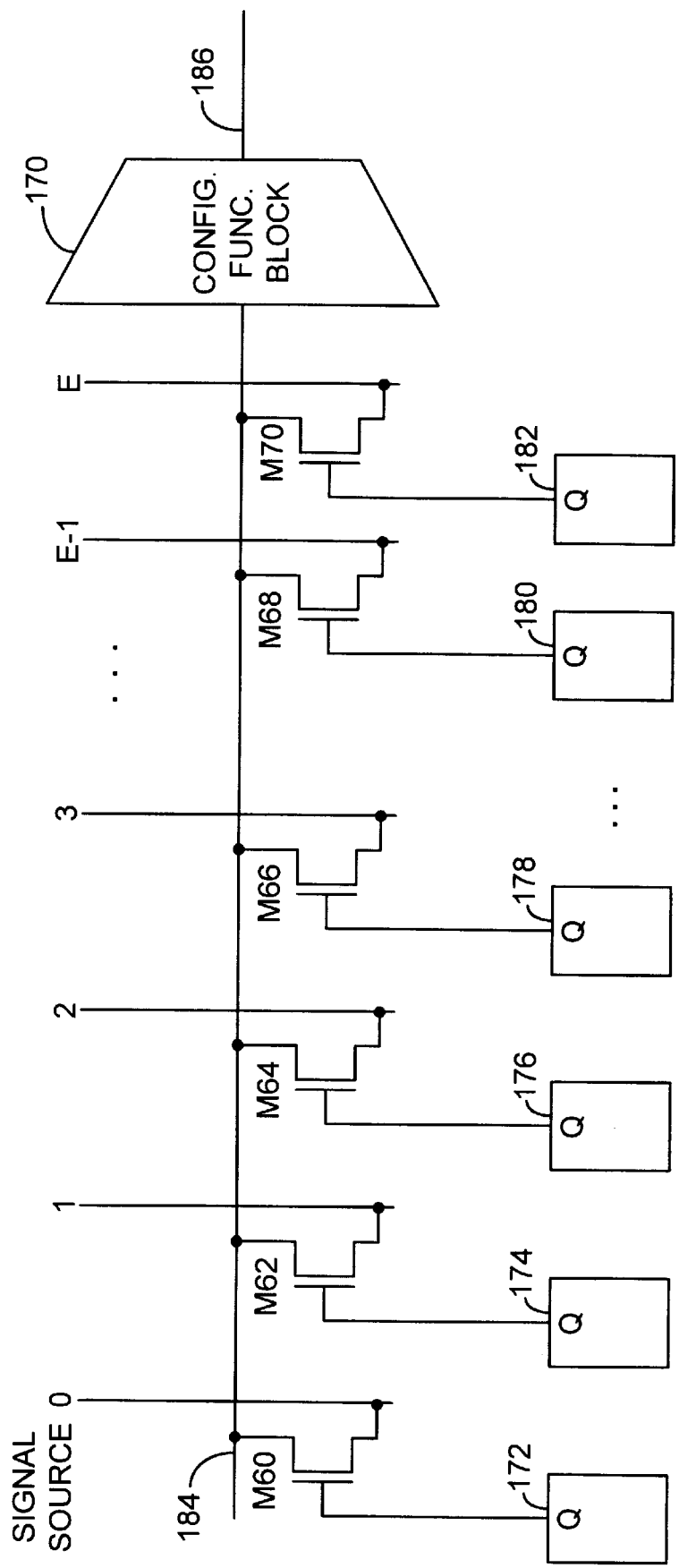
FIG. 7 is a schematic diagram illustrating a functional block that may be included in functional groups used in the FPGA shown in FIG. 1.
Figure 8:
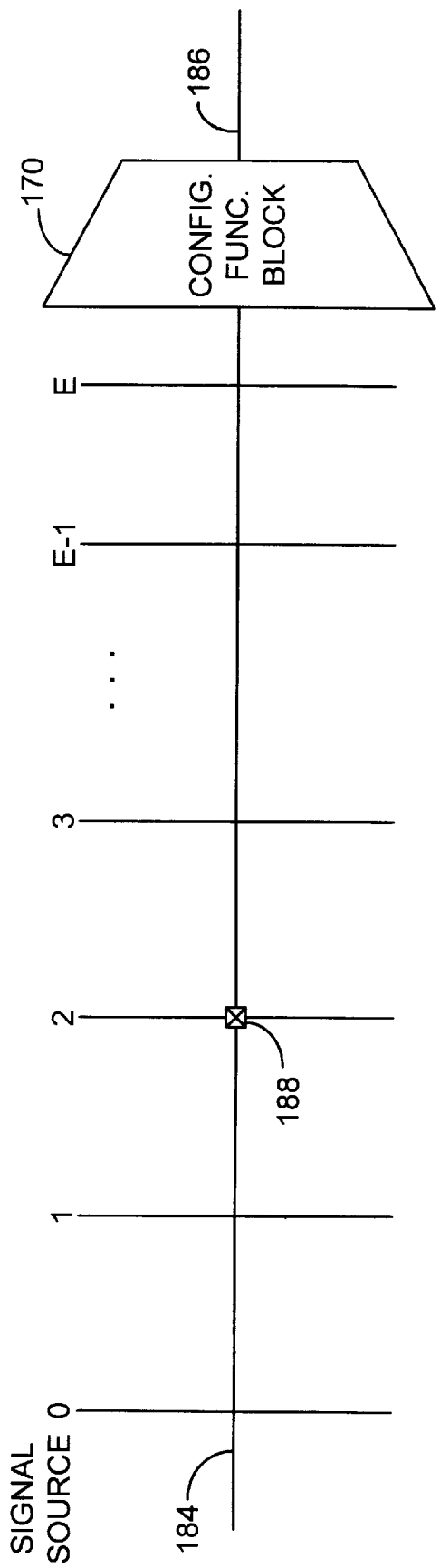
FIG. 8 is a schematic diagram illustrating a functional block that may be included in functional groups used in the HA shown in FIG. 1.

Another example which shows that the FPGA 22 and the HA 24 include the same underlying logic structure is illustrated in FIGS. 7 and 8. Specifically, FIG. 7 illustrates a configurable functional block 170 that may be included in the FPGA 22 and which utilizes several memory cells 172, 174, 176, 178, 180, 182. Configurable functional blocks typically include memory cells and connection transistors that may be used to configure logic functions such as addition, subtraction, etc., inside of an FPGA. A configurable functional block typically needs to select its inputs from a routing resource. The configurable functional block 170 includes an input 184 and an output 186. A selected one of the signal sources 0, 1, 2, 3, . . . E is connected to the input 184 by turning on the corresponding one of the connection transistors M60, M62, M64, M66, . . . M70. The connection transistors M60, M62, M64, M66, . . . M70 are turned on and off by the Q output of the corresponding memory cells 172, 174, 176, 178, . . . 182. In other words, a single one of the E signal sources can be selected as the input 184 of the configurable functional block 170 by programming only one of the memory cells 172, 174, 176, 178, . . . 182 to have a "1" on its Q output. The configuration data that is used to program the memory cells 172, 174, 176, 178, . . . 182 is generated by the design software.

The connection transistors M60, M62, M64, M66, . . . M70 and the memory cells 172, 174, 176, 178, . . . 182 form a selection circuit (or multiplexer). It should be well understood that this selection circuit is just one example of a type of selection circuit that may be included in the FPGA 22. Many other different types of selection circuits may be included in the FPGA 22 in accordance with the present invention. For example, the FPGA 22 may include any of the selection circuits described in copending U.S. patent application Ser. No. 09/250,781, filed Feb. 12, 1999, entitled "MULTI-DIMENSIONAL PROGRAMMABLE INPUT SELECTION APPARATUS AND METHOD", invented by Chung-yuan Sun, and commonly assigned herewith, the full disclosure of which is hereby incorporated into the present application by reference.

While FIG. 7 illustrates a version of the configurable functional block 170 that is included in the FPGA 22, FIG. 8 illustrates a version of the configurable functional block 170 that is included in the HA 24. As can be seen in FIG. 8, the transistors M60, M62, M64, M66, . . . M70 and the memory cells 172, 174, 176, 178, . . . 182 have been removed from the configurable functional block 170 when it is used in the HA 24. The basic structure of the configurable functional block 170, however, remains the same in the HA 24. Furthermore, the number of signal sources 0, 1, 2, 3, . . . E available to the input 184 remains the same. FIG. 8 illustrates the basic structure that is included in the HA 24 no matter what type of selection circuit is used in FIG. 7.

In the HA 24, instead of using the design software to program memory cells to select one of the signal sources 0, 1, 2, 3, . . . E for the input 184 of the configurable functional block 170, the design software is used to generate data indicating which one of the signal sources 0, 1, 2, 3, . . . E should be coupled directly to the input 184. This connection is made during the IC manufacturing process using a metal connection. For example, if signal source 2 is supposed to be coupled to input 184, then the design software will indicate that signal source 2 is to be coupled to input 184 at point 188 with a metal connection. Again, the metal connection 188 may be made with a via hole connection (vertical connection) or by depositing metal (horizontal connection). Furthermore, the metal connection 188 is made during the IC manufacturing process, preferably in the last one or two mask steps.

As demonstrated by FIGS. 5, 6, 7 and 8, the FPGA 22 and the HA 24 include the same underlying logic structure. Namely, FIGS. 5 and 7 illustrate circuitry included in the FPGA 22, and FIGS. 6 and 8 illustrate the corresponding circuitry that is included in the HA 24. Thus, the IC 20 includes the FPGA 22 that is based on a specific underlying logic and routing structure. An example of a specific underlying logic and routing structure on which the FPGA 22 may be based is illustrated in FIG. 2. The FPGA 22 also includes a plurality of transistors and memory cells coupled to the specific underlying logic and routing structure that are used for programming the specific underlying logic and routing structure. Examples of these transistors and memory cells in the FPGA 22 is illustrated in FIGS. 3, 5 and 7.

The IC 20 also includes (on the same semiconductor substrate 18) the HA 24 that is based on the same specific underlying logic and routing structure on which the FPGA 22 is based. Thus, the specific underlying logic and routing structure shown in FIG. 2 is also the specific underlying logic and routing structure on which the HA 24 is based. The HA 24, however, does not include transistors and memory cells coupled to the specific underlying logic and routing structure that are used for programming the specific underlying logic and routing structure. Examples of the absence of these transistors and memory cells in the HA 24 is illustrated in FIGS. 4, 6 and 8. The underlying logic and routing structure of the HA 24 includes metal connections resulting from the HA 24 being programmed. The metal connections are placed by way of mask metal programming.

Stated in further detail, the FPGA 22 includes a set of functional groups 36, 38, 40, 42, 44, 46 that each include an underlying logic structure and memory cells for programming the underlying logic structure. The FPGA 22 also includes a set of routing buses and a set of routing interconnect areas as illustrated in FIGS. 2 and 3 that provide interconnections between the functional groups and the routing buses. The routing interconnect areas include transistors and memory cells for programming the interconnections. The HA 24 includes a set of functional groups that is equal in number to and arranged like the set of functional groups in the FPGA 22. In other words, the functional groups in the HA 24 are arranged as illustrated in FIG. 2. Furthermore, each functional group in the HA 24 includes an underlying logic structure that is like the underlying logic structure of the functional groups in the FPGA 22. The functional groups in the HA 24, however, do not include memory cells for programming the underlying logic structure. The HA 24 also includes a set of routing buses and routing interconnect areas that are arranged like the routing buses and routing interconnect areas of the FPGA 22. The routing interconnect areas of the HA 24, however, do not include transistors and memory cells for programming interconnections. This is illustrated in FIG. 4.

The FPGA 22 also includes a set of interface groups 26, 28, 30, 32, 34 for providing interfaces to the set of routing buses. Each interface group includes an underlying logic structure and memory cells for programming the underlying logic structure. The HA 24 also includes a set of interface groups that are equal in number to and are arranged like the set of interface groups in the FPGA 22. Furthermore, the interface groups in the HA 24 including an underlying logic structure that is like the underlying logic structure of the interface groups in the FPGA 22 but which do not include memory cells for programming the underlying logic structure.

The present invention also includes a method of making the IC 20 shown in FIG. 1. Specifically, such a method includes forming the FPGA 22 on the semiconductor substrate 18. As described above, the FPGA 22 will be formed such that it is based on a specific underlying logic and routing structure and includes transistors and memory cells coupled to the specific underlying logic and routing structure for programming the specific underlying logic and routing structure. The method also includes forming the HA 24 on the semiconductor substrate 18. As described above the HA 24 is based on the same specific underlying logic and routing structure as the FPGA 22, but the HA 24 does not include transistors and memory cells coupled to the specific underlying logic and routing structure that are used for programming the specific underlying logic and routing structure. An optional aspect of the present invention is that the HA 24 is programmed by making metal connections in its underlying logic and routing structure. The metal connections may be made during a final mask step of the IC 20 manufacturing process.

As described above, the FPGA 22 and the HA 24 include the same underlying logic and routing structure, except that all of the excess circuitry (such as transistor switches and memory cells) has been removed from the HA 24. Because the FPGA 22 and the HA 24 have the same underlying logic and routing structure, the same design software can be used for both. As discussed above, the design software is used for programming the FPGA 22 and for designing the HA 24. The design software is also used for running simulations to simulate various configurations of the FPGA 22 and the HA 24. The user or designer runs such simulations in order to verify that the FPGA 22 and the HA 24 performs the tasks that they are programmed/designed to perform.

One advantage of the ability to use the same design software for both devices is that when the FPGA 22 and the HA 24 are embedded in the same IC 20, the devices can be simulated and/or modeled while they are working together using the same design software package. This saves the designer from having to manually combine the results of two different design software packages. Another advantage is that the HA 24 design can be a model of a commonly used device, such as for example a PCI or USB controller, and that model can be included in the design software so that the user or designer can design the FPGA 22 portion using the model for the HA 24. In this scenario, the designer can run simulations of the FPGA 22 working with the model for the HA 24. All of the data will be consistent between the FPGA 22 and the HA 24 because a single design software package is used.

Figure 9A:
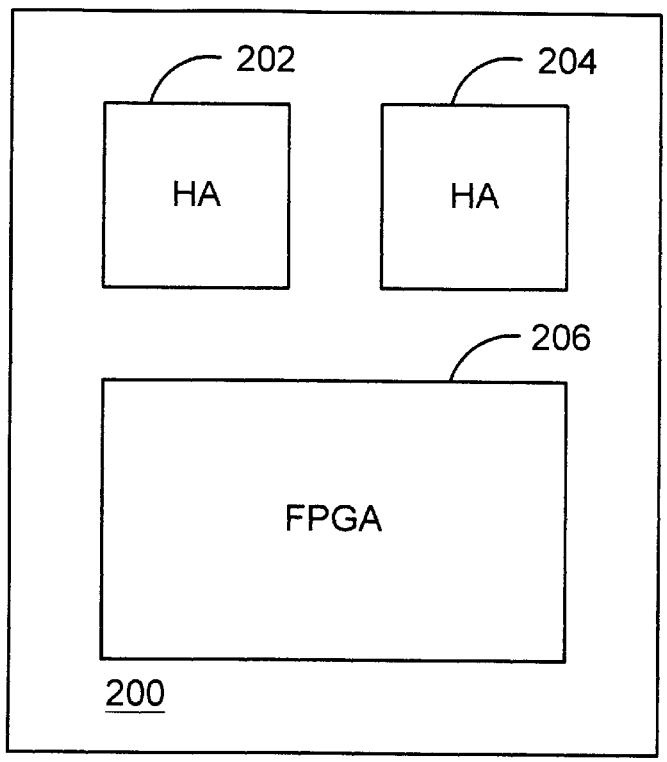
FIGS. 9A, 9B and 9C are block diagrams illustrating additional ICs in accordance with the present invention.
Figure 9B:
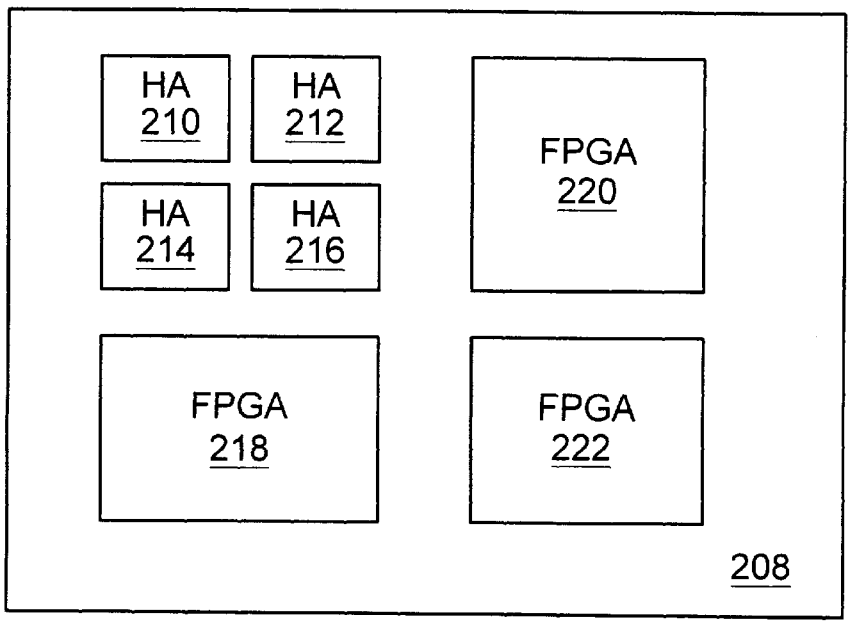
Figure 9C:
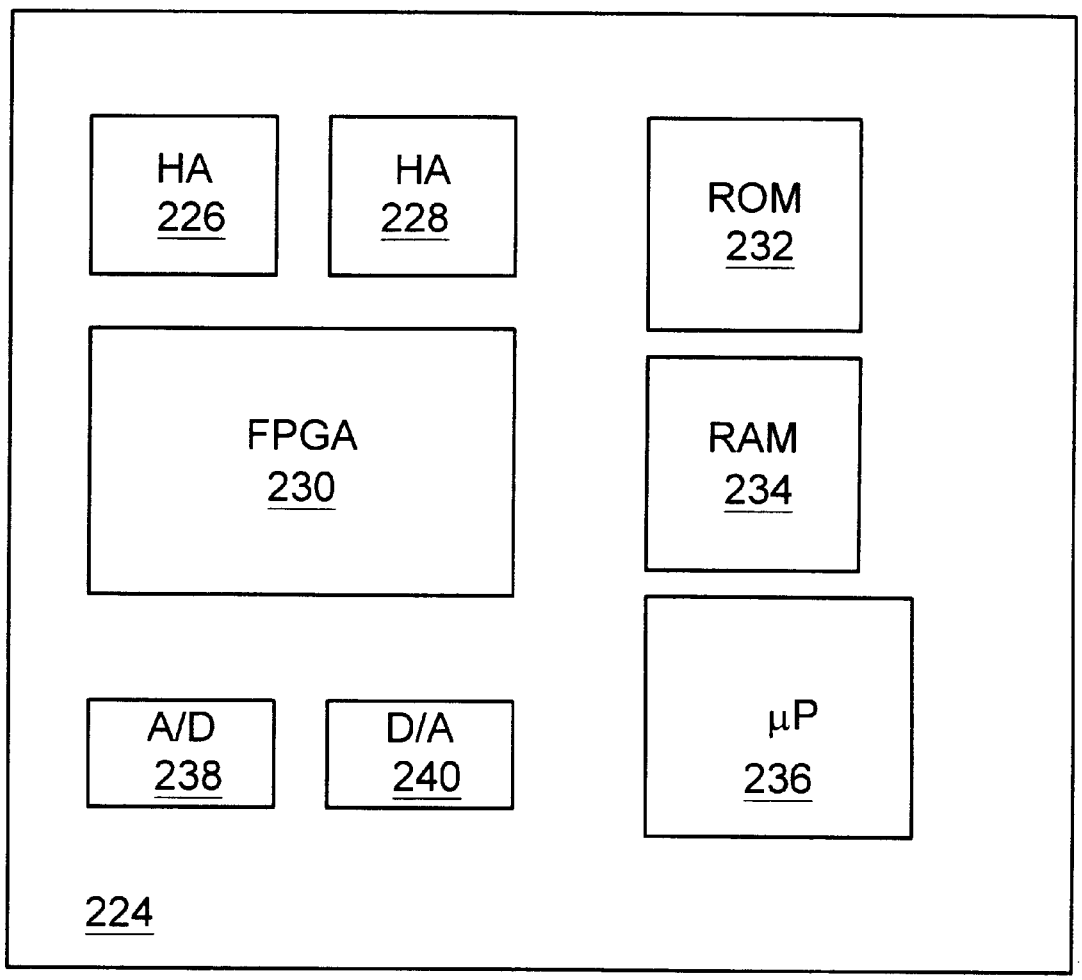

As mentioned above, the IC 20 may include more than one FPGA and/or more than one HA and that such FPGA(s) and HA(s) may be arranged in any configuration on the IC 20. Thus, the number of FPGA(s) and HA(s) on a single chip can be varied. Depending on the application requirements, the number of HA(s) can be greater, equal or less than the number of FPGA(s). This is illustrated in FIGS. 9A, 9B and 9C. Specifically, FIG. 9A shows an IC 200 having two HAs 202, 204 and one FPGA 206. FIG. 9B shows an IC 208 having four HAs 210, 212, 214, 216 and three FPGAs 218, 220, 222. FIG. 9C shows a system on a chip (SOC) 224 having two HAs 226, 228, one FPGA 230, and several other components. The other components may include, for example, a read only memory (ROM) 232, a random access memory (RAM) 234, a microprocessor 236, an analog-to-digital converter (A/D) 238, and a digital-to-analog converter (D/A) 240. It should be well understood that the specific types of other components and the number of other components included on the SOC 224 will vary greatly depending on the particular application.

It should be well understood that the configurations shown in FIGS. 9A, 9B and 9C are examples and that the number of FPGA(s) and HA(s) on the single chip and the specific configuration and/or arrangement of those devices can be varied in accordance with the present invention. Again, an important feature of the present invention is that the FPGA(s) and HA(s) include the same underlying logic and routing structure with the excess circuitry having been removed from the HA(s) as described above.

Figure 10A:
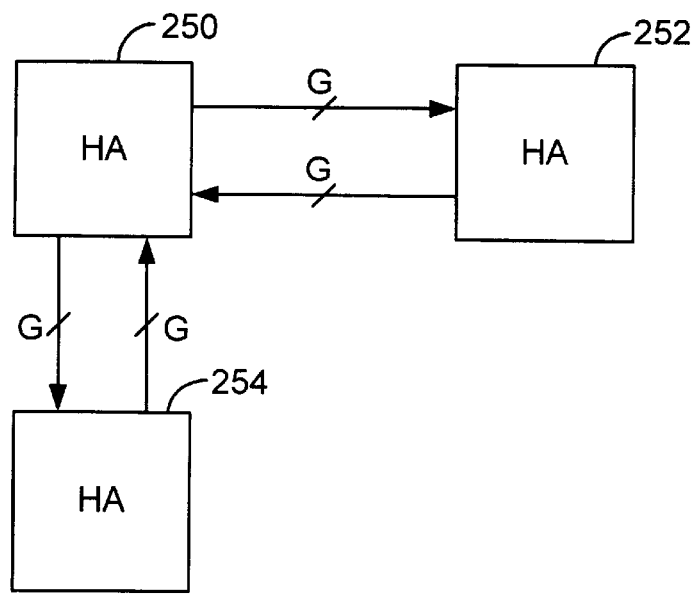
FIGS. 10A and 10B are block diagrams illustrating direct interfacing of HAs and FPGAs, respectively.
Figure 10B:
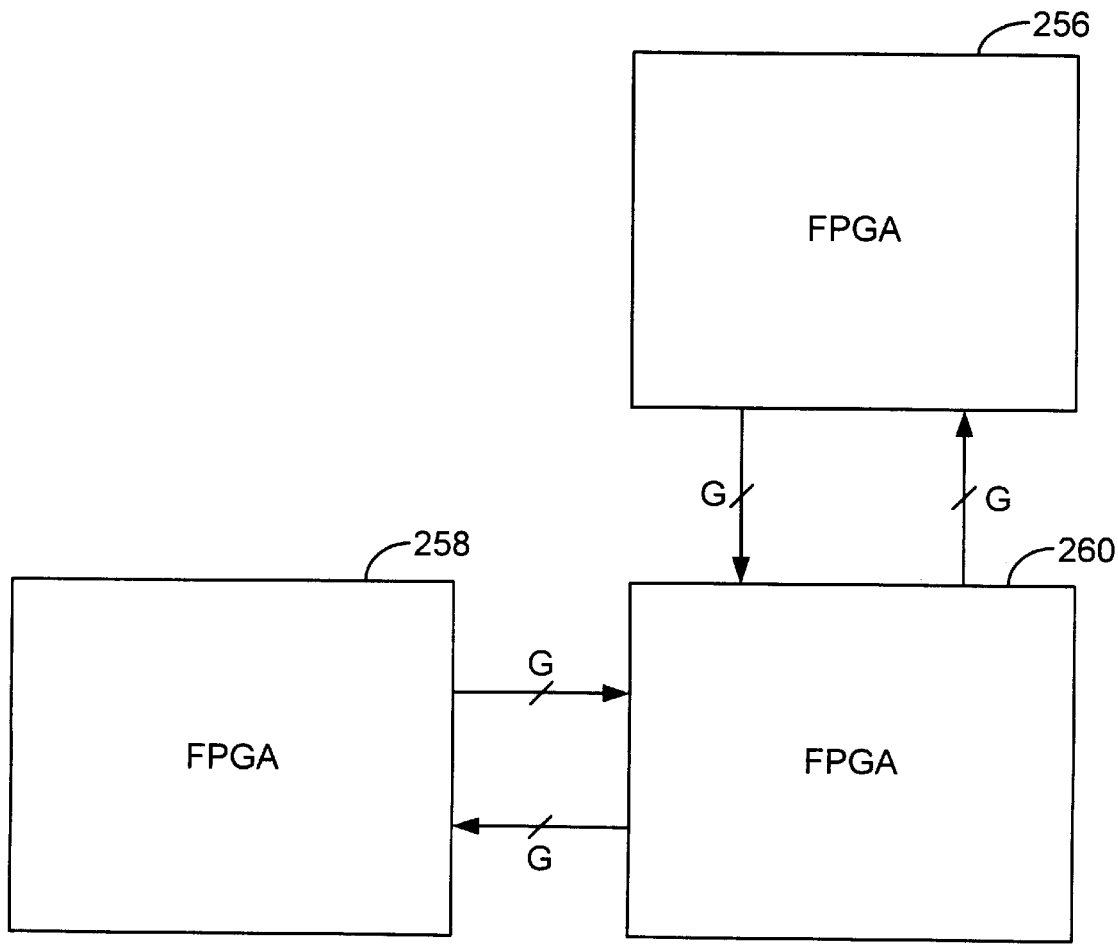

The interface between FPGA(s) and HA(s) on a single IC chip may be direct, indirect or through a specific interface area that mimics the chips on the board. Such interfacing between FPGA(s) and HA(s) is implemented by connecting the interface groups (IGs) of each device in some way. FIG. 10A illustrates direct interfacing between HAs, and FIG. 10B illustrates direct interfacing between FPGAs. Specifically, in FIG. 10A three HAs 250, 252, 254 are interfaced with each other. Because each of the HAs 250, 252, 254 includes the same number of incoming and outgoing lines, i.e., G number of lines coming in and G number of lines going out, the HAs 250, 252, 254 can be directly connected together. Furthermore, because the HAs 250, 252, 254 are all the same size, the direct connections can be easily made. Similarly, in FIG. 10B three FPGAs 256, 258, 260 are interfaced with each other. The three FPGAs 256, 258, 260 are each the same size and includes the same number of incoming and outgoing lines, i.e., G number of lines coming in and G number of lines going out. Thus, directly connecting the three FPGAs 256, 258, 260 together is relatively easy.

Figure 11:
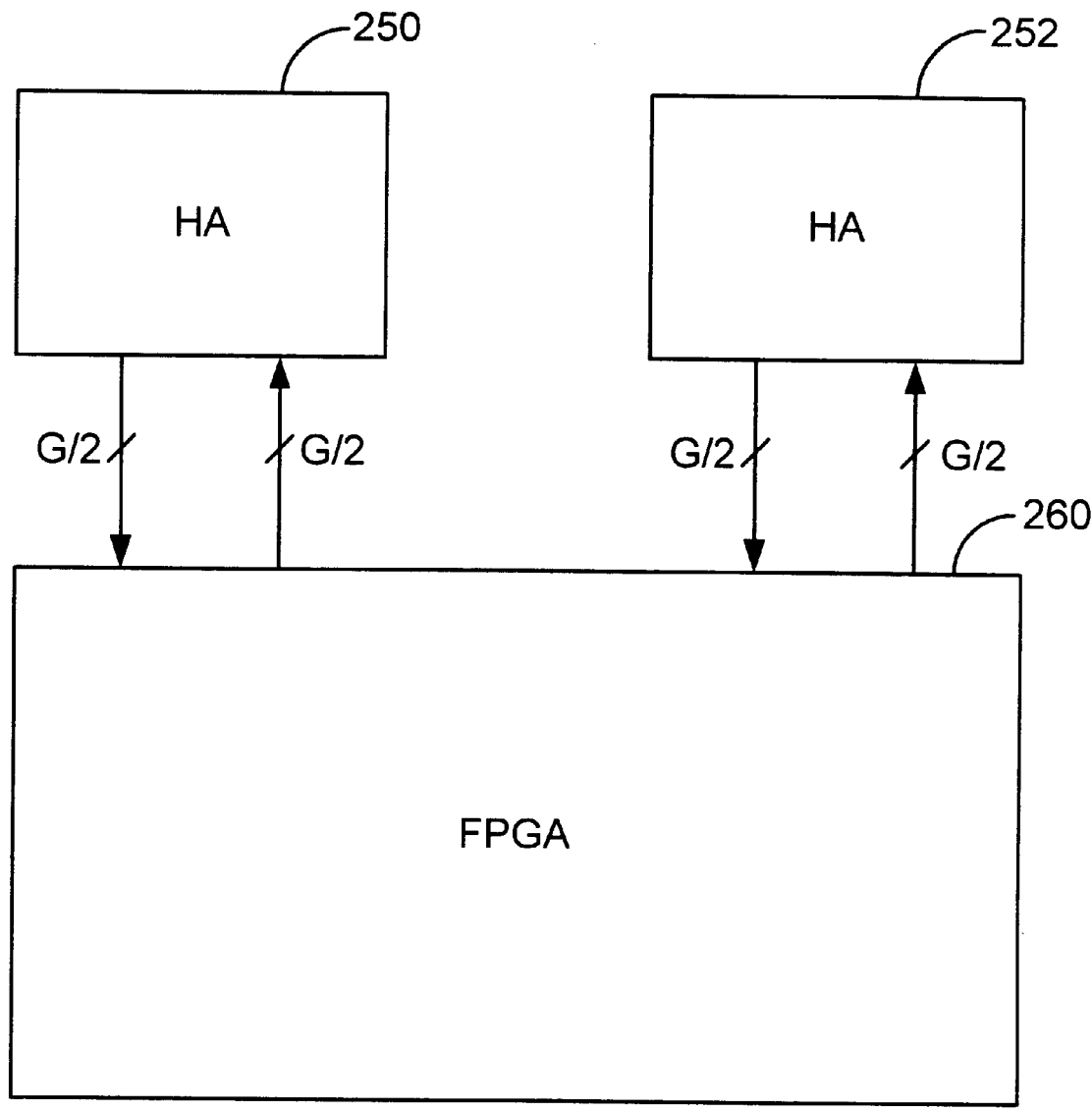
FIG. 11 is a block diagram illustrating direct interfacing of HAs with an FPGA.

Referring to FIG. 11, there is illustrated one way to directly interface the FPGA 260 with the two HAs 250, 252. Because the HAs 250, 252 each have the same underlying logic and routing structure as the FPGA 260, each of the HAs 250, 252 has the same number of incoming and outgoing lines as the FPGA 260, i.e., G number of lines coming in and G number of lines going out. This means that the two HAs 250, 252 combined have twice as many incoming and outgoing lines as the FPGA 260. Furthermore, because the HAs 250, 252 are each smaller in size than the FPGA 260, the incoming and outgoing lines of each of the HAs 250, 252 do not physically align with the incoming and outgoing lines of the FPGA 260. In other words, there is a mismatch in the number of lines.

Therefore, one way to interface the two HAs 250, 252 with the FPGA 260 is to utilize only half of the available incoming and outgoing lines of the HAs 250, 252. As shown in FIG. 11, the HA 250 uses only G/2 incoming lines and only G/2 outgoing lines, and the HA 252 uses only G/2 incoming lines and only G/2 outgoing lines. Thus, by using this method some of the lines of the HAs 250, 252 are not used. It should be well understood, however, that this is only one way to interface HA(s) with FPGA(s) and that there are numerous other ways the interfacing may be done in accordance with the present invention.

Figure 12:
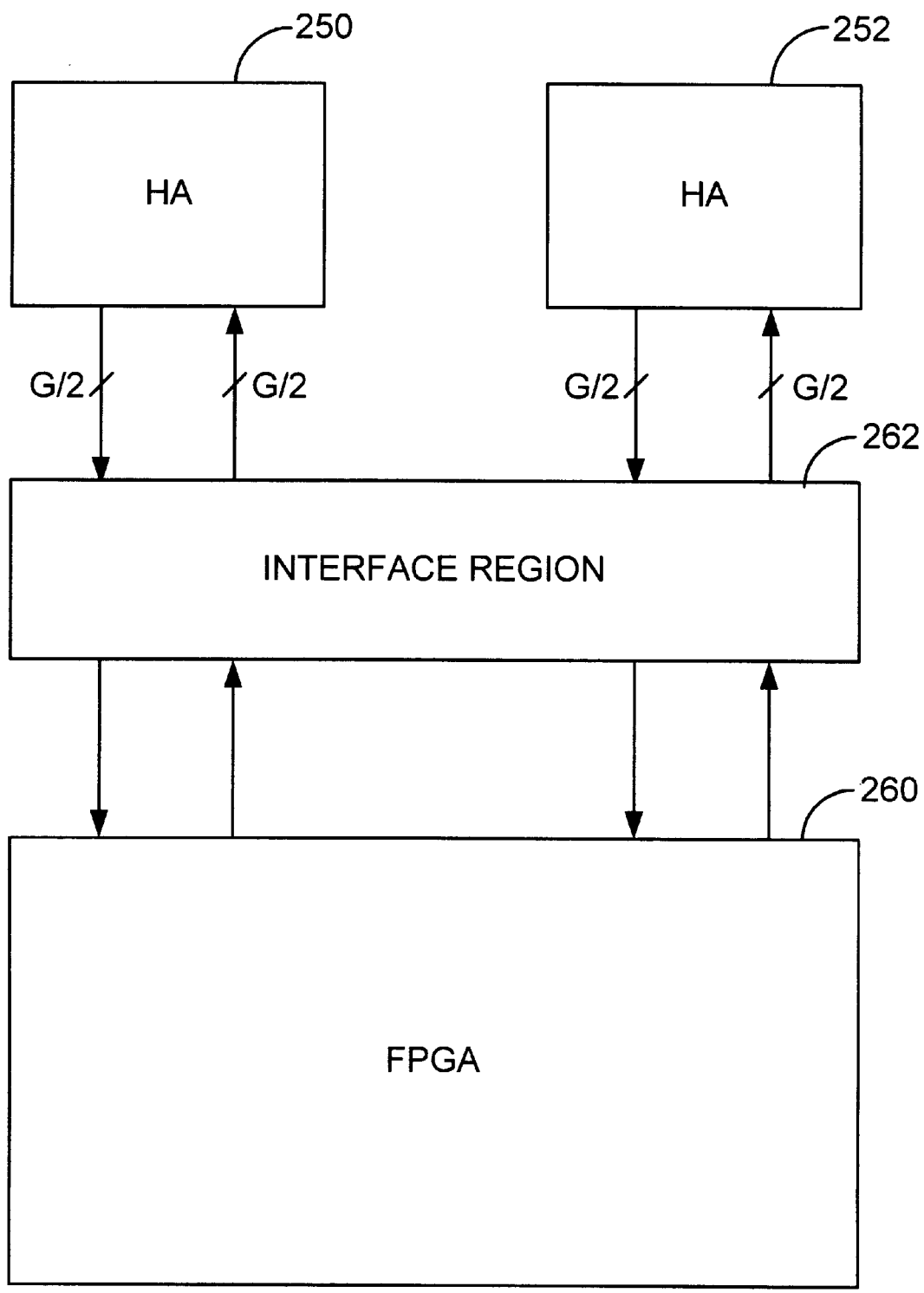
FIG. 12 is a block diagram illustrating the use of an interface region in the interfacing of HAs with an FPGA.
Figure 13:
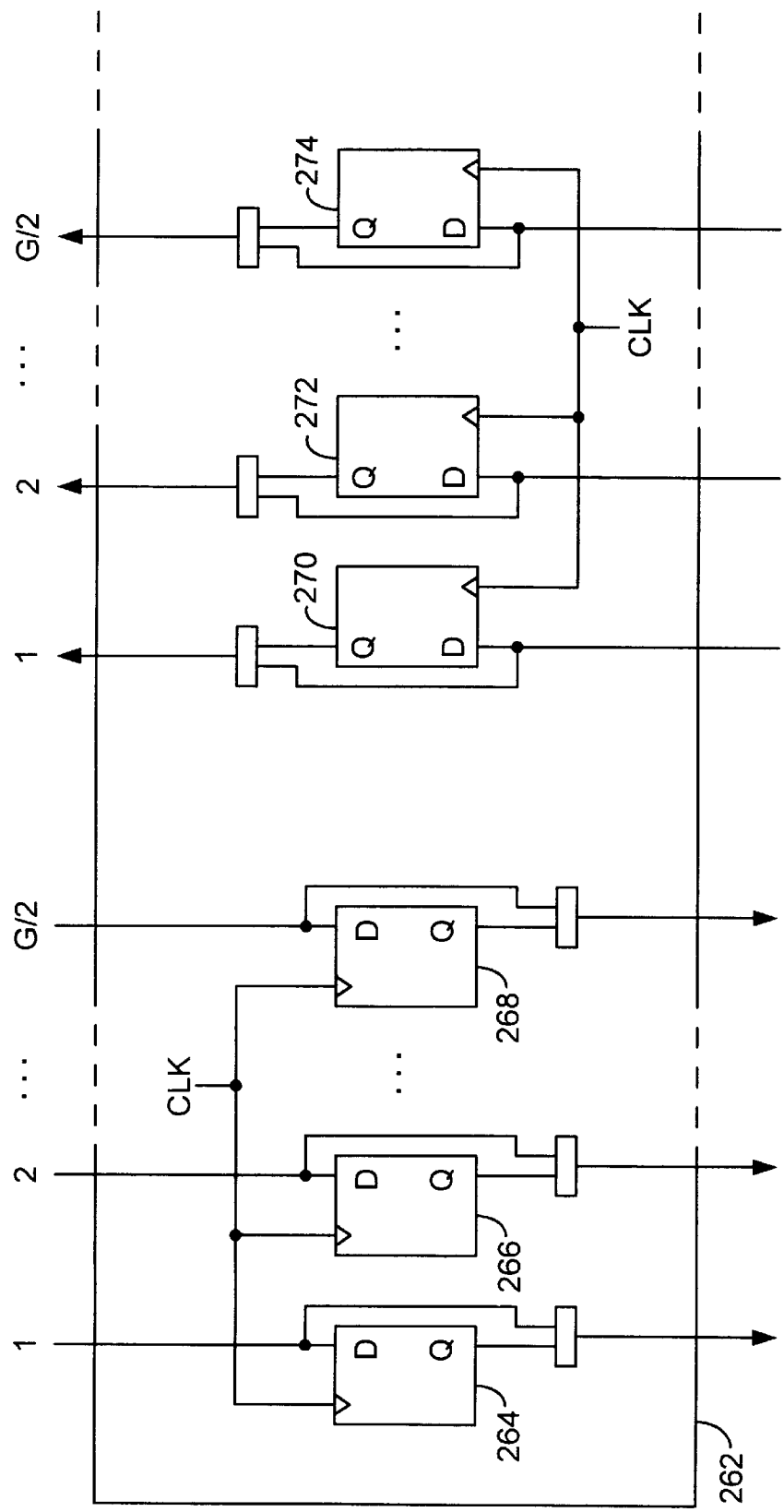
FIG. 13 is a schematic diagram illustrating the interface region shown in FIG. 12.

FIG. 12 illustrates another way to interface the FPGA 260 with the two HAs 250, 252. As shown, an interface region 262 is inserted between the FPGA 260 and the two HAs 250, 252. FIG. 13 illustrates a portion of the interface region 262 in more detail. The interface region 262 may be used to hold several flip-flops 264, 266, 268, 270, 272, 274 that are inserted into the incoming and outgoing lines of the FPGA 260 and HAs 250, 252. The flip-flops 264, 266, 268, 270, 272, 274 can be used to compensate for the difference in the speed of the FPGA 260 and HAs 250, 252. Specifically, the HAs 250, 252 are very fast devices and are generally faster than the FPGA 260. In order to compensate for the difference in speed, the results of a calculation performed by, for example, the HA 250 can be stored in the flip-flops 264, 266, 268 until the FPGA 260 is ready to receive the data. Once the FPGA 260 is ready, it can take the data from the flip-flops 264, 266, 268. Thus, an input flip-flop/latch and output flip-flop/latch can be added to provide synchronization of speed differences and fast access.

While flip-flops may be used in the FPGA-HA interface region 262, it should be understood that flip-flops are not required. Other devices, such as for example buffers, single direction tristate buffers, bidirectional buffers, latches, and JTAG (Joint Test Action Group) scan cells, may be used in the interface region 262 in addition to, or instead of, flip-flops. JTAG scan cells are typically used to implement a boundary scan architecture that has been adopted as IEEE Standard 1149.1 (commonly known as JTAG). JTAG scan cells can be used to mimic the chips on a board by making the interface lines "controllable" and "observable" so that the circuits in the HA can be tested separately from the FPGA. Specifically, the JTAG boundary scan architecture allows every I/O pin on a chip to be controlled and observed via a serially connected scan path. The scan path may be formed by inserting a scan flip-flop in each I/O. Through this scan path, one can test the connectivity between all chips on a densely populated board. Without the scan path it would be difficult to control and/or observe all pins of all chips.

The interface region 262 could also be used for interfacing HA(s) with HA(s) as shown in FIG. 10A or for interfacing FPGA(s) with FPGA(s) as shown in FIG. 10B. It should be well understood, however, that use of the interface region 262 is optional and that HA(s) and FPGA(s) can be interfaced in many other ways.

Figure 14A:
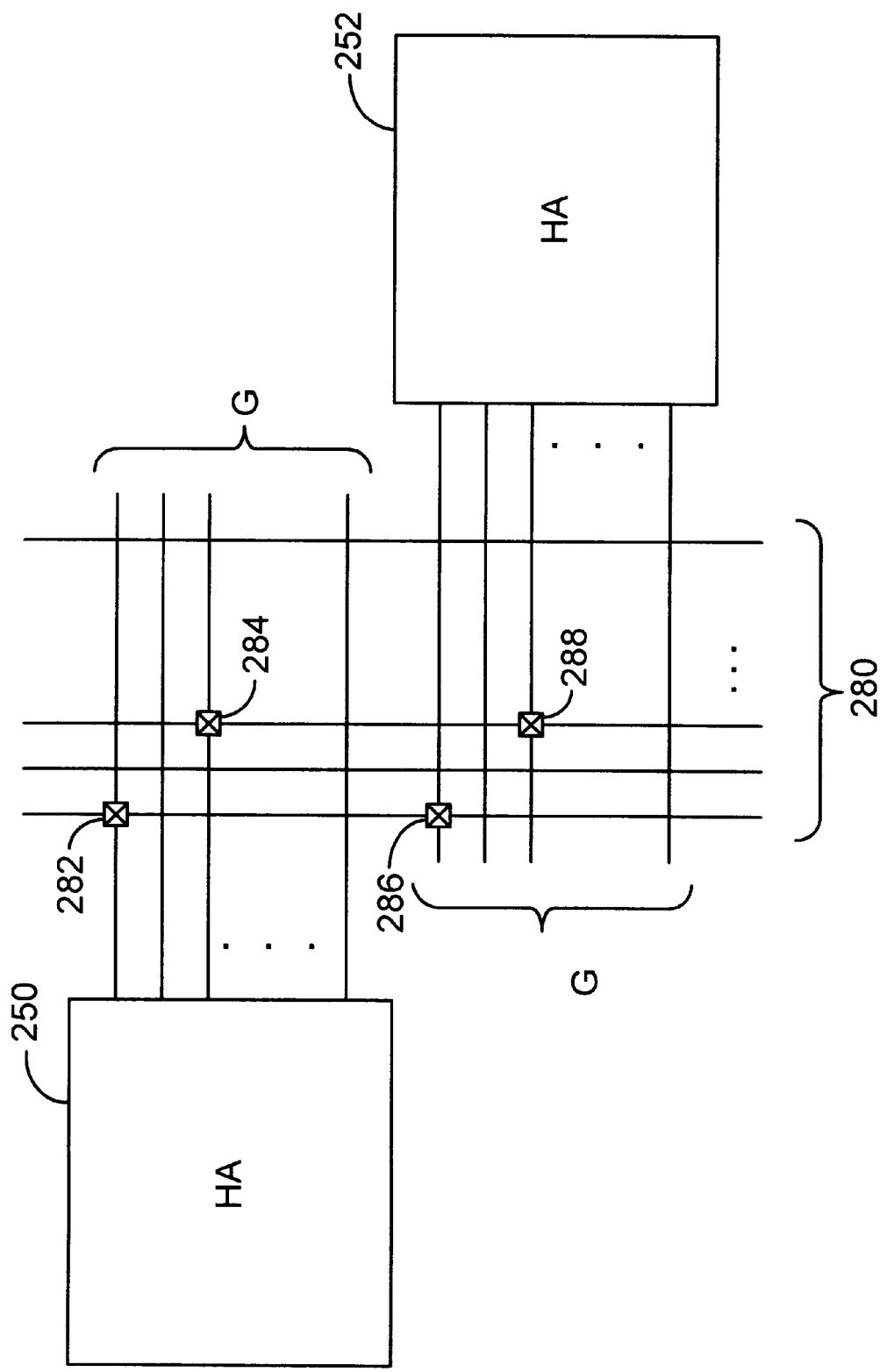
FIGS. 14A and 14B are schematic diagrams illustrating indirect interfacing of HAs and FPGAs, respectively.
Figure 14B:
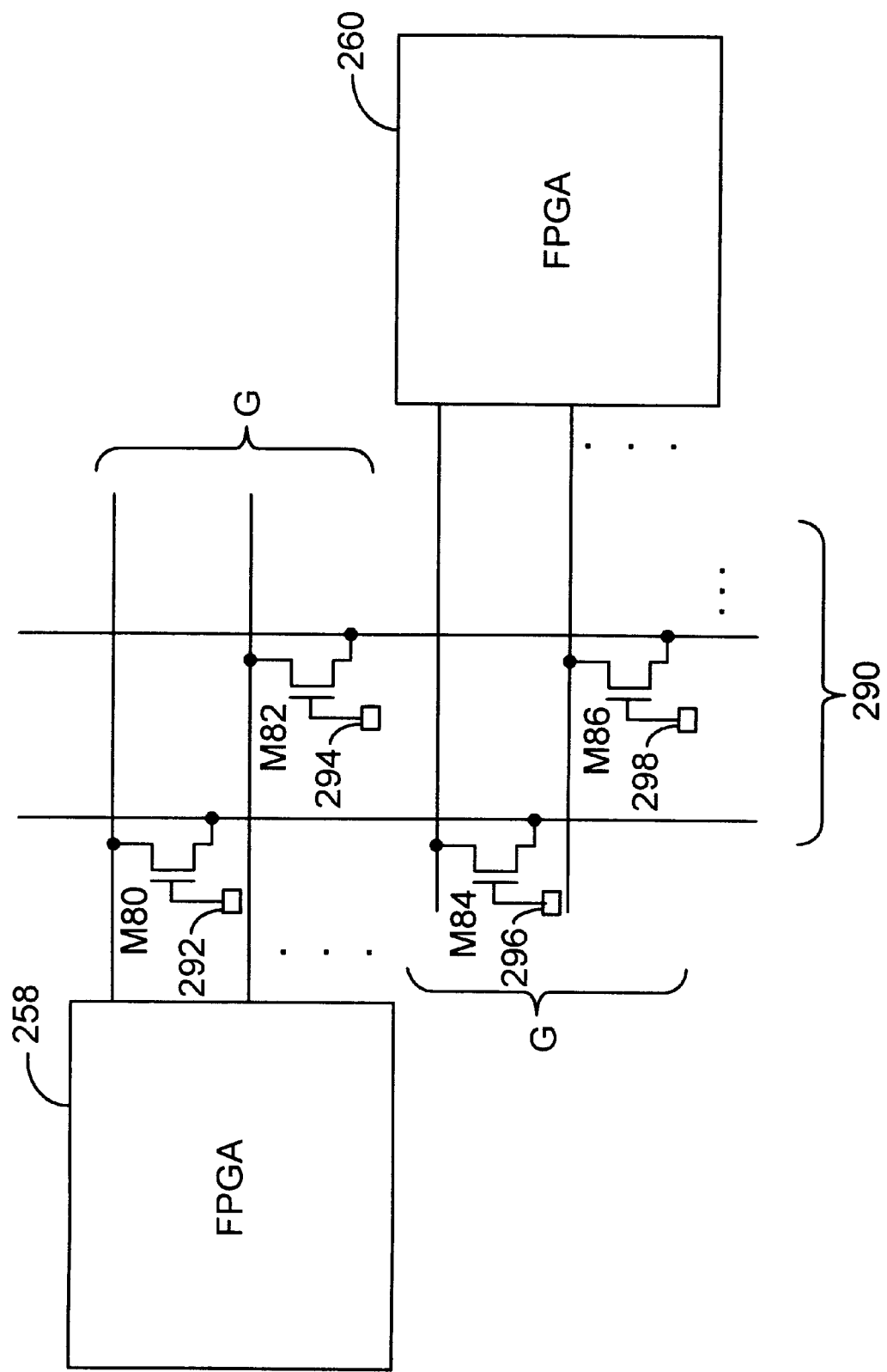

For example, FIGS. 14A and 14B illustrate examples of indirect interfacing. FIG. 14A shows the interfacing of the HAs 250, 252. The outgoing lines of HA 250 are connected to a bus 280 at, for example, points 282, 284. The incoming lines of HA 252 are connected to the bus 280 at the appropriate places, such as for example points 286, 288. In this way the outgoing signals of HA 250 are routed to the inputs of HA 252. One advantage of this method of interfacing is that the HAs 250, 252 do not have to be physically aligned. Similar to above, the metal connections 282, 284, 286, 288 may be made with via hole connections (vertical connections) or by depositing metal (horizontal connections). Furthermore, the metal connections are made during the IC manufacturing process, preferably in the last one or two mask steps.

FIG. 14B shows the interfacing of the FPGAs 258, 260. The outgoing lines of the FPGA 258 may be programmably connected to a bus 290 by way of transistors M80, M82 and corresponding memory cells 292, 294. The incoming lines of FPGA 260 are programmably connected to the bus 290 at the appropriate places by way of transistors M84, M86 and corresponding memory cells 296, 298. In this way the outgoing signals of FPGA 258 are routed to the inputs of FPGA 260, and the FPGAs 258, 260 do not have to be physically aligned. Furthermore, the connections are programmable, i.e., they can be switched on and off by programming memory cells 292, 294, 296, 298.

Figure 15:
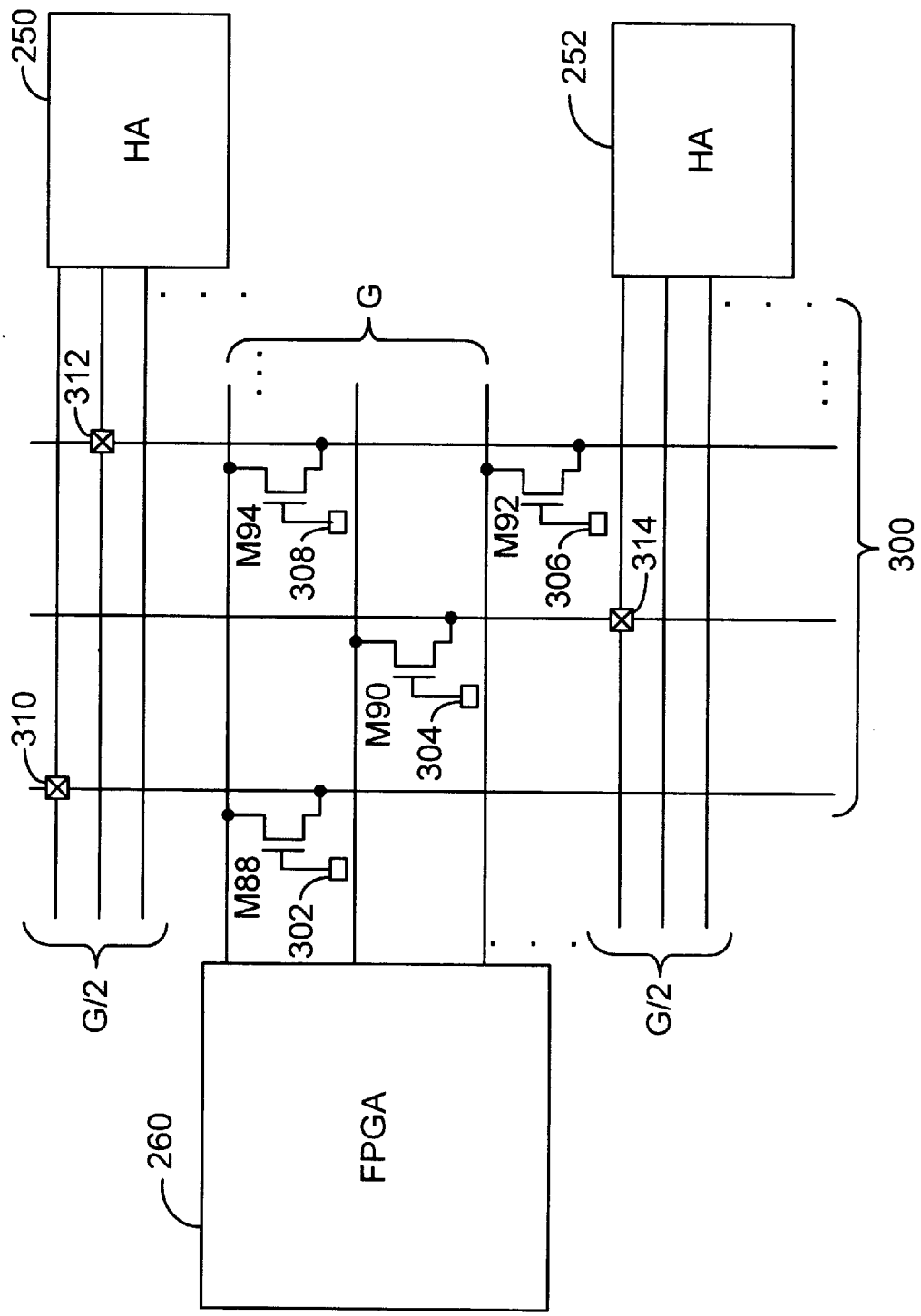
FIG. 15 is a schematic diagram illustrating indirect interfacing of HAs with an FPGA.

FIG. 15 shows the interfacing of the FPGA 260 with the HAs 250, 252 using a combination of the techniques shown in FIGS. 14A and 14B. Specifically, the outgoing lines of the FPGA 260 may be programmably connected to a bus 300 by way of transistors M88, M90, M92, M94 and corresponding memory cells 302, 304, 306, 308. The incoming lines of HA 250 are connected to the bus 300 at the appropriate places, such as for example points 310, 312, with metal connections. The incoming lines of HA 252 are connected to the bus 300 at the appropriate places, such as for example point 314, with metal connections. Again, the metal connections 310, 312, 314 may be made with via hole connections (vertical connections) or by depositing metal (horizontal connections) during the IC manufacturing process. By coupling the outgoing lines of the FPGA 260 to the bus 300 with transistors, the outgoing lines of the FPGA 260 can be programmably routed to a different one of the HAs 250, 252. Thus, the outgoing signals of the FPGA 260 can be routed to the inputs of the HAs 250, 252 even though the devices are not physically aligned.

It should be understood that FIGS. 14A, 14B and 15 illustrate examples of indirect interfacing and that variations and combinations of the techniques illustrated in those figures may be used to interface FPGA(s) and HA(s) in accordance with the present invention.

Figure 16:
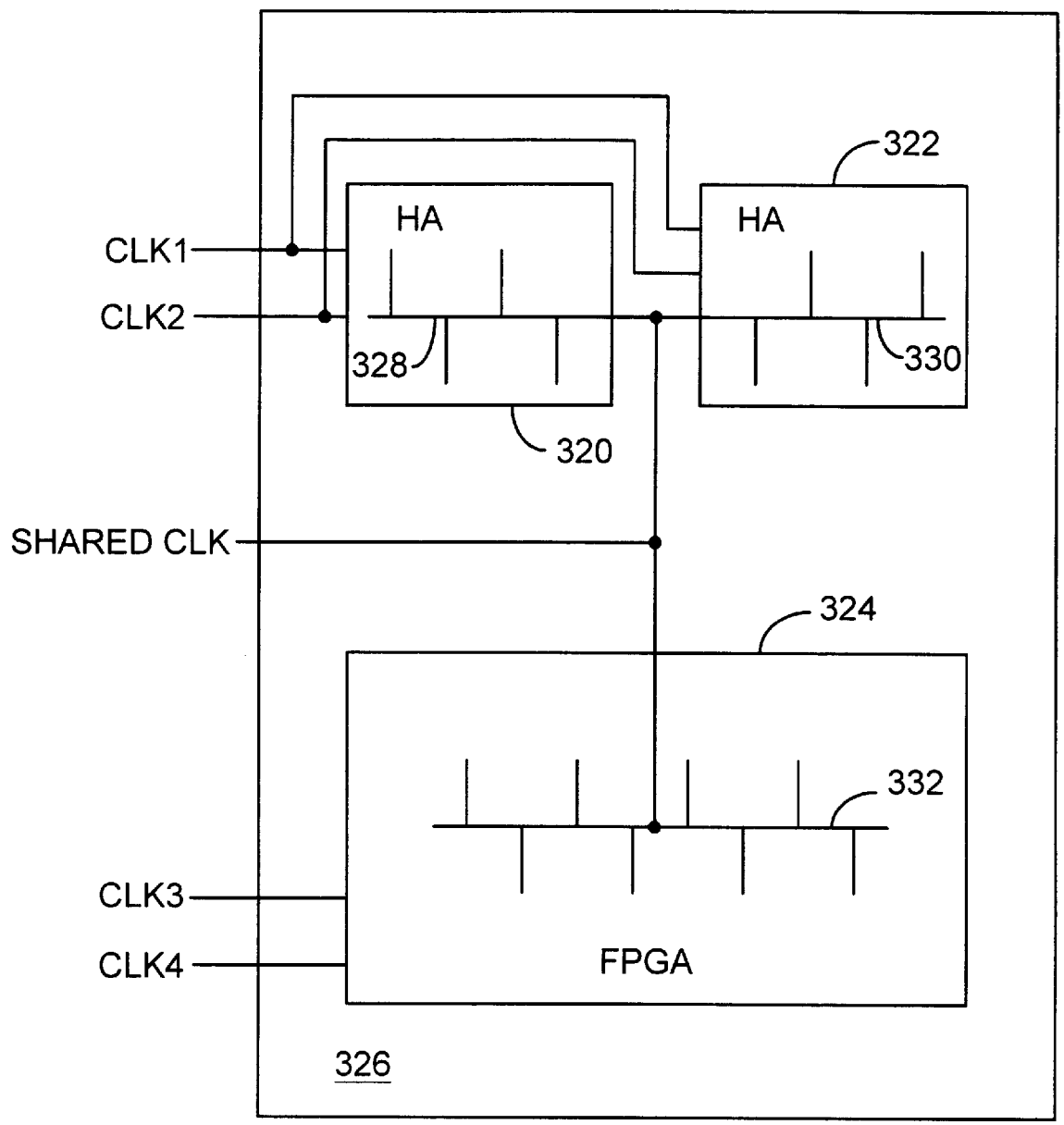
FIG. 16 is a schematic diagram illustrating a clocking scheme that may be used with HAs and FPGAs.

FIG. 16 illustrates one way that clock synchronizing between an FPGA 324 and two HAs 320, 322 embedded in an IC 326 can be performed. Specifically, for internal operations within and between the HAs 320, 322, either CLK1, CLK2 or the shared clock (shared CLK) may be used. Similarly, for internal operations within the FPGA 324, either CLK3, CLK4 or the shared clock may be used. For operations between the FPGA 324 and one or both of the HAs 320, 322, however, the difference in the speed of the devices typically needs to be taken into account. In this scenario, the shared clock may be used, or an interface having flip-flops like the interface region 262 discussed above may be used. The shared clock will run the devices at the same speed, or the flip-flops in the interface region 262 will store the results of the faster HAs 320, 322 until the slower FPGA 324 can accept the data. In other words, if there are flip-flops in an interface region creating a delay, the shared clock is not needed. But if there is a direct connection with no interface region and no flip-flops, the shared clock will typically be used.

The shared CLK is a hard-wired clock that is distributed throughout both the HAs 320, 322 and the FPGA 324. This is illustrated by clock branches 328, 330, 332. The shared clock will synchronize the different devices and it helps to prevent clock skew, miscommunication, imbalance, and other problems. The shared clock is typically used when transferring data from an HA to an FPGA, but it can also be used for internal operations of both an HA and FPGA. The FPGA 324 will typically include flip-flop circuitry to permit either the shared hard-wired clock (shared CLK) or one of CLK3 or CLK4 to be programmably selected.

Figure 17:
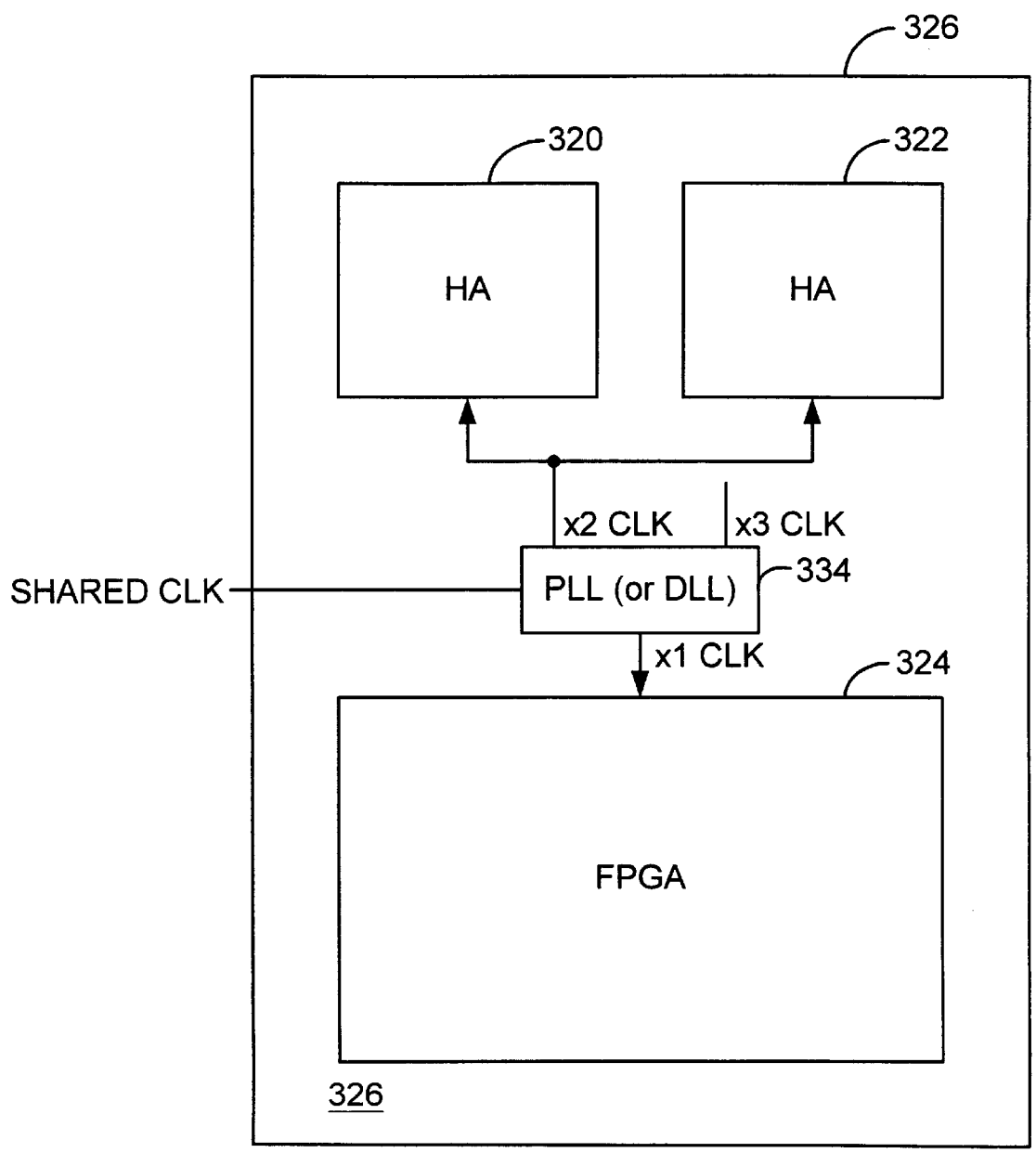
FIG. 17 is a schematic diagram illustrating an alternative clocking scheme that may be used with HAs and FPGAs.

FIG. 17 illustrates another way that clock synchronizing between the FPGA 324 and the HAs 320, 322 may be performed. Specifically, a phase lock loop (PLL) or a delay line loop (DLL) 334 can be used to synthesize and synchronize clocks between the FPGA 324 and the HAs 320, 322. For example, the PLL 334 can receive the shared clock and generate a ×1 CLK for the slower FPGA 324 and ×2 or ×3 CLKs for the faster HAs 320, 322.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An integrated circuit (IC) comprising:
    a field-programmable gate array (FPGA) that is based on a specific underlying logic and routing structure and that includes a plurality of transistors and memory cells coupled to the specific underlying logic and routing structure for programming the specific underlying logic and routing structure; and
    a hard array (HA) that is also based on the specific underlying logic and routing structure but which does not include transistors and memory cells coupled to the specific underlying logic and routing structure that are used for programming the specific underlying logic and routing structure, wherein
        the FPGA further includes a first set of functional groups that each include memory cells for programming the functional group; and
        the HA further includes a second set of functional groups that is equal in number to the first set of functional groups and that are arranged like the first set of functional groups but which do not include memory cells for programming the functional groups.

2. An IC in accordance with claim 1, wherein the first and second sets of functional groups include identical underlying logic structures.

3. An integrated circuit (IC) comprising:
    a field-programmable gate array (FPGA) that is based on a specific underlying logic and routing structure and that includes a plurality of transistors and memory cells coupled to the specific underlying logic and routing structure for programming the specific underlying logic and routing structure; and a hard array (HA) that is also based on the specific underlying logic and routing structure but which does not include transistors and memory cells coupled to the specific underlying logic and routing structure that are used for programming the specific underlying logic and routing structure, wherein the FPGA further includes a first set of interface groups for providing interfaces to devices external to the FPGA, each interface group in the first set of interface groups including memory cells for programming the interface group; and the HA further includes a second set of interface groups for providing interfaces to devices external to the HA, the second set of interface groups being equal in number to the first set of interface groups and being arranged like the first set of interface groups but not including memory cells for programming the interface group.

4. An IC in accordance with claim 3, wherein the first and second sets of interface groups include identical underlying logic structures.

5. An integrated circuit (IC) comprising:

a field-programmable gate array (FPGA) that includes,
a first set of functional groups that each include an underlying logic structure and memory cells for programming the underlying logic structure;
a first set of routing buses; and
a first set of routing interconnect areas that provide interconnections between the first set of functional groups and the first set of routing buses, the first set of routing interconnect areas including transistors and memory cells for programming the interconnections; and a hard array (HA) that includes,
a second set of functional groups that is equal in number to the first set of functional groups and that are arranged like the first set of functional groups, each functional group in the second set of functional groups including an underlying logic structure that is like the underlying logic structure of the first set of functional groups but which does not include memory cells for programming the underlying logic structure;
a second set of routing buses that are arranged like the first set of routing buses; and
a second set of routing interconnect areas that are arranged like the first set of routing interconnect areas but which do not include transistors and memory cells for programming interconnections.

6. An IC in accordance with claim 5, wherein:

the FPGA further includes a first set of interface groups for providing interfaces to the first set of routing buses, each interface group in the first set of interface groups including an underlying logic structure and memory cells for programming the underlying logic structure; and the HA further includes a second set of interface groups for providing interfaces to the second set of routing buses, the second set of interface groups being equal in number to the first set of interface groups, being arranged like the first set of interface groups, and including an underlying logic structure that is like the underlying logic structure of the first set of interface groups but which does not include memory cells for programming the underlying logic structure.

7. An IC in accordance with claim 5, wherein the second set of functional groups and the second set of routing interconnect areas include metal connections resulting from the HA being programmed.

8. An IC in accordance with claim 7, wherein the metal connections are placed by way of mask metal programming.

9. An IC in accordance with claim 7, wherein the metal connections are placed by way of via hole connection programming.

10. An IC in accordance with claim 5, further comprising an additional FPGA.

11. An IC in accordance with claim 5, further comprising an additional HA.

12. An IC in accordance with claim 5, wherein the FPGA and the HA are directly interfaced together.

13. An IC in accordance with claim 5, further comprising: an interface region through which the FPGA and the HA are interfaced together.

14. An IC in accordance with claim 13, wherein the interface region comprises flip-flops for storing data during data transfers.

15. An IC in accordance with claim 5, wherein the FPGA and the HA operate using a shared clock.

16. A method of making an integrated circuit (IC), the method comprising:

forming a field-programmable gate array (FPGA) on a semiconductor substrate, the FPGA based on a specific underlying logic and routing structure and including a plurality of transistors and memory cells coupled to the specific underlying logic and routing structure for programming the specific underlying logic and routing structure; and forming a hard array (HA) on the semiconductor substrate, the HA also based on the specific underlying logic and routing structure but not including transistors and memory cells coupled to the specific underlying logic and routing structure that are used for programming the specific underlying logic and routing structure, wherein the step of forming the FPGA further includes forming a first set of functional groups that each include memory cells for programming the functional group; and the step of forming the HA further includes forming a second set of functional groups that is equal in number to the first set of functional groups and that are arranged like the first set of functional groups but which do not include memory cells for programming the functional groups.

17. A method in accordance with claim 16, wherein the first and second sets of functional groups include identical underlying logic structures.

* * * * *